US012742256B2

(12) United States Patent
Hudson et al.

(10) Patent No.: US 12,742,256 B2
(45) Date of Patent: Sep. 22, 2026

(54) MODELING THERMAL DONOR FORMATION AND TARGET RESISTIVITY FOR SINGLE CRYSTAL SILICON INGOT PRODUCTION

(71) Applicant: GlobalWafers Co., Ltd., Hsinchu (TW)

(72) Inventors: Carissima Marie Hudson, St. Charles, MO (US); JaeWoo Ryu, Chesterfield, MO (US); Michael Robbin Seacrist, Lake St. Louis, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 897 days.

(21) Appl. No.: 17/954,585

(22) Filed: Sep. 28, 2022

(65) Prior Publication Data

US 2023/0112094 A1 Apr. 13, 2023

Related U.S. Application Data

(60) Provisional application No. 63/254,337, filed on Oct. 11, 2021.

(51) Int. Cl.

*C30B 15/20* (2006.01)
*C30B 15/04* (2006.01)
*C30B 29/06* (2006.01)
*C30B 33/02* (2006.01)

(52) U.S. Cl.

CPC .............. *C30B 15/20* (2013.01); *C30B 15/04* (2013.01); *C30B 29/06* (2013.01); *C30B 33/02* (2013.01)

(58) Field of Classification Search

CPC ......... C30B 15/04; C30B 15/20; C30B 29/06; C30B 33/02

See application file for complete search history.

(56) References Cited

U.S. PATENT DOCUMENTS

| | | | |
|---|---|---|---|
| 10,337,117 B2 | 7/2019 | Caspary et al. | |
| 2009/0226737 A1 | 9/2009 | Kurita et al. | |
| 2012/0238070 A1* | 9/2012 | Libbert | H01L 21/76251 438/455 |
| 2014/0363904 A1 | 12/2014 | Hoshi et al. | |

(Continued)

FOREIGN PATENT DOCUMENTS

| | | |
|---|---|---|
| CN | 102912424 A | 2/2013 |
| EP | 2697412 A1 | 10/2012 |

(Continued)

OTHER PUBLICATIONS

Kamiura et al., "A new family of thermal donors generated around 450 in phosphorus doped Czochralski silicon," J. Appl. Phys. 65 (2), Jan. 15, 1989 (Year: 1998).*

(Continued)

*Primary Examiner* — Hua Qi

(74) *Attorney, Agent, or Firm* — Armstrong Teasdale LLP

(57) ABSTRACT

Methods for producing single crystal silicon ingots are disclosed. The methods may involve modeling formation of thermal donors and target resistivity during downstream annealing processes such as during subsequent device manufacturing such as manufacturing of interposer devices. The model may output a pre-anneal wafer resistivity target range. The single crystal silicon ingot production process may be modeled to determine a counter-doping schedule to achieve the pre-anneal wafer resistivity target range across a longer length of the main body of the ingot.

20 Claims, 22 Drawing Sheets

(56) References Cited

U.S. PATENT DOCUMENTS

| | | | | |
|---|---|---|---|---|
| 2017/0062568 | A1* | 3/2017 | Caspary | H10D 62/60 |
| 2017/0213821 | A1* | 7/2017 | Or-Bach | H10D 84/85 |
| 2017/0260645 | A1* | 9/2017 | Hoshi | C30B 29/06 |
| 2018/0179660 | A1* | 6/2018 | Phillips | C30B 15/04 |
| 2018/0230622 | A1 | 8/2018 | Caspary et al. | |
| 2018/0237937 | A1 | 8/2018 | Kang et al. | |
| 2020/0208294 | A1* | 7/2020 | Hudson | C30B 15/20 |
| 2020/0407869 | A1 | 12/2020 | Luter et al. | |
| 2022/0205131 | A1 | 6/2022 | Wu et al. | |

FOREIGN PATENT DOCUMENTS

| | | | |
|---|---|---|---|
| EP | 2737304 | A1 | 6/2014 |
| EP | 2737305 | A1 | 6/2014 |
| JP | 2016050140 | A | 4/2016 |
| JP | 2016060667 | A | 4/2016 |
| JP | 2016216306 | A | 12/2016 |
| JP | 06073316 | B2 | 2/2017 |
| JP | 06222013 | B2 | 11/2017 |
| JP | 06299543 | B2 | 3/2018 |
| JP | 06304125 | B2 | 4/2018 |
| KR | 1674819 | B1 | 11/2016 |
| WO | 2016031164 | A1 | 3/2016 |
| WO | 2017026648 | A1 | 2/2017 |
| WO | 2017202656 | A1 | 11/2017 |

OTHER PUBLICATIONS

Londos et al., Effect of oxygen concentration on the kinetics of thermal donor formation in silicon at temperatures between 350 and 500 C, American Institute of Physics, Appl. Phys. Lett. 62 (13), Mar. 29, 1993, pp. 1525-1526.

Voronkov et al., “Properties of Fast-Diffusing Oxygen Species in Silicon Deduced from the Generation Kinetics of Thermal Donors”, Solid State Phenomena vols. 156-158, 2010, pp. 1525-116.

Forster et al., “Compensation engineering for uniform n-type silicon ingots”, Solar Energy Materials And Solar Cells, Elsevier Science Publishers, vol. 111, Jan. 31, 2013, pp. 146-152.

Kamiura et al., “A new family of thermal donors generated around 450° C. in phosphorus-doped Czochralski silicon”, Journal Of Applied Physics, vol. 65, No. 2, Jan. 15, 1989, pp. 600-605.

* cited by examiner

450C/ 20hr anneal

Oi=2 nppma
Oi=3 nppma
Oi=4 nppma
Oi=4.5 nppma
Oi=5 nppma
Oi=6 nppma
Oi=8 nppma

Final resistivity after anneal (ohm cm)

10000
1000
100
10

10
100
1000

Starting resistivity (ohm cm)

MODELING THERMAL DONOR FORMATION AND TARGET RESISTIVITY FOR SINGLE CRYSTAL SILICON INGOT PRODUCTION

CROSS-REFERENCE TO RELATED APPLICATION

This application claims the benefit of U.S. Provisional Patent Application No. 63/254,337, filed Oct. 11, 2021, which is incorporated herein by reference in its entirety.

FIELD OF THE DISCLOSURE

The field of the disclosure relates to methods for producing single crystal silicon ingots and, in particular, methods for modeling formation of thermal donors and changes in resistivity during downstream annealing processes.

BACKGROUND

Interposers are a mechanical platform that connect circuits between neighboring active devices. Interposer technology has enabled a cost effective solution for 2.5D integration in integrated circuits and packaging. Interposers reduce interconnect length for increased device speeds via through silicon vias (TSV), package form factors and enable heterogeneous device integration.

Single crystal silicon is typically used as a substrate for interposers because it has a relatively small coefficient of thermal expansion mismatch with device components which are also often silicon-based. Thermal-mechanical stress that occurs during processing silicon is small and via technology in silicon has been well established. Passive devices such as radiofrequency (RF) circuitry may be integrated relatively easily.

Single crystal silicon is commonly prepared by the so-called Czochralski (CZ) process. A seed crystal is immersed into molten silicon and an ingot is grown from the melt by slow extraction. The resulting ingot is sliced into wafers which may be used as an interposer substrate.

Some silicon interposer applications such as RF may include higher resistivity p-type silicon substrates (e.g., 75 ohm-cm or more, 300 ohm-cm or more or even 1000 ohm-cm or more). Maintaining relatively high resistivity for RF can be challenging if the device undergoes downstream low temperature processes (e.g., 300° C. to 500° C. anneals). Oxygen incorporated into the wafer may form electrically active oxygen clusters called "thermal double donors" (TDD) or simply "thermal donors" (TD) in this temperature range. The thermal donor generation rate is strongly dependent on both temperature and interstitial oxygen concentration. Due to the temperature and time range at which interposers are fabricated, the oxygen related thermal donors may shift the resistivity beyond acceptable limits or even cause a type shift (i.e., P-type to N-type). In some instances, crystal productivity (as measured by prime usable length) may be impacted in order to ensure resistivity remains in specification at the longer downstream anneal times.

A need exists for methods for tuning single crystal silicon ingot production to increase the prime portion of the ingot and/or that account for downstream resistivity shifts caused by formation of thermal donors.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a method for producing a single crystal silicon ingot from a silicon melt held within a crucible. A post-anneal target resistivity for wafers sliced from the ingot is determined. Thermal donors generated during a subsequent anneal of wafers sliced from the ingot is modeled to determine a pre-anneal wafer resistivity target range. A dopant profile of the melt during ingot growth is modeled to determine a counter-doping schedule in which at least a portion of the ingot is within the pre-anneal wafer resistivity target range. Polycrystalline silicon is added to the crucible. The polycrystalline silicon is heated to cause a silicon melt to form in the crucible. A first dopant is added to the crucible. The first dopant is p-type or n-type. The melt is contacted with a seed crystal. The seed crystal is withdrawn from the melt to form a single crystal silicon ingot. A second dopant is added to the silicon melt while forming the single crystal silicon ingot based on the counter-doping schedule. The second dopant is p-type or n-type and is of a type different from the type of the first dopant.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Provisions of the present disclosure relate to methods for producing single crystal silicon ingots. Wafers sliced from the ingot are annealed downstream such as during device fabrication (e.g., during formation of interposer devices). Example methods of the present disclosure include determining a post-anneal target resistivity for the wafers sliced from the ingot. The post-anneal target resistivity is the desired resistivity of the silicon wafer upon which the devices are built (or chips when the wafer is cut into chips before the anneal). The thermal donors (which may also be referred to herein as "thermal double donors") generated during a subsequent anneal of the wafers sliced from the ingot are modeled to determine a target resistivity for wafers formed from the ingot (pre-anneal resistivity). The melt may then be systematically doped (e.g., counter-doped) to assure that a greater portion of the ingot has the pre-anneal target resistivity.

Figure 1:
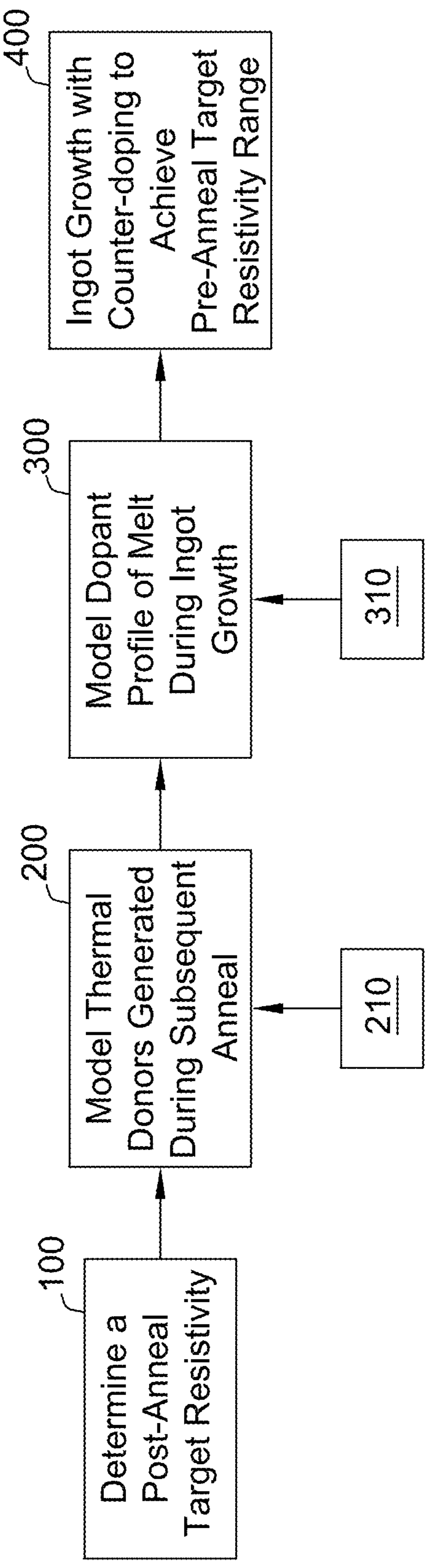
FIG. 1 is a block diagram of a method for producing a single crystal silicon ingot.

An embodiment of the method of the present disclosure is shown in FIG. 1. In a first step 100, a post-anneal target resistivity for wafers sliced from the ingot is determined. The target resistivity may be the desired resistivity at which the subsequent device operates (i.e., of the single crystal silicon substrate portion of the device). The target resistivity is the resistivity after one or more anneals of the wafer are conducted such as during device fabrication. The target resistivity may be a minimum resistivity, maximum resistivity, or range of resistivities. In some embodiments, such as for interposer devices, the desired resistivity for the device (i.e., after fabrication heat treatments) may be at least 75 ohm-cm, at least 300 ohm-cm, or at least 1,000 ohm-cm (e.g., from 75 ohm-cm to 5,000 ohm-cm or from 100 ohm-cm to 1,500 ohm-cm). In other embodiments, even higher resistivities such as up to 20,000 ohm-cm may be used.

In a second step 200, the amount of thermal donors generated during the subsequent anneal of wafers sliced from the ingot is modeled. By modeling the thermal donors (which act as electron donors similar to n-type dopants), the change in resistivity caused by thermal donor generation during the subsequent anneal can be determined. Knowing the change in resistivity during the subsequent anneal allows a pre-anneal wafer resistivity target range to be determined (e.g., minimum resistivity, maximum resistivity, or range of resistivity). For example, for p-type substrates, the pre-anneal target resistivity equals the post-anneal target resistivity minus the increase in resistivity caused by thermal donor formation during the anneal. For n-type substrates the pre-anneal target resistivity equals the post-anneal target resistivity plus the decrease in resistivity caused by thermal donor formation during the anneal.

Any suitable model may be used to determine the change of resistivity from thermal donor generation during the anneal(s). For example, the model may be based on calculations from or derived from Voronkov et al., "Properties of Fast-Diffusing Oxygen Species in Silicon Deduced from the Generation Kinetics of Thermal Donors", Solid State Phenomena, Vols. 156-158 (2010), pp. 115-122, which is incorporated herein by reference for all relevant and consistent purposes. The calculations may be based on other published studies of thermal donor formation such as Londos et al., "Effect of Oxygen Concentration on the Kinetics of Thermal Donor Formation in Silicon at Temperatures between 35° and 500° C.", Applied Physics Letters Vol. 62, 1525 (1993), which is also incorporated herein by reference for all relevant and consistent purposes. In some embodiments, the model may be based on empirical data relating to changes in resistivity that occur during the anneal.

In some embodiments, inputs 210 related to the anneal and/or substrate may be input into the model to determine thermal donor formation and/or changes in resistivity that occur during the anneal. For example, suitable inputs 210 include the oxygen concentration of the ingot/wafers (which may be based on customer specifications are ingot growth system capability), anneal temperature, anneal length of time, and starting resistivity and type. The model may output the number of thermal donors that are generated, and this output may be used to determine the change of resistivity and type caused by the anneal. Alternatively or in addition, the model may output the change of resistivity during the anneal or the final resistivity and type after the anneal. The change in resistivity resulting from the anneal is used to determine the pre-anneal wafer resistivity target range.

In accordance with embodiments of the present disclosure, the particulars of the downstream anneal which are input into the model may be selected based on a downstream device (e.g., interposer device) fabrication method. In some embodiments, the subsequent anneal is at a temperature of at least 300° C., at least 350° C., at least 400° C., at least 450° C., at least 500° C., or from 300° C. to 500° C. The length of the anneal may be at least 5 hours, at least 10 hours or at least 20 hours (e.g., 5 to 40 hours).

In step 300, the dopant profile of the melt during ingot growth is modeled. The dopant profile is modeled to determine a counter-doping schedule that may maximize the length of the ingot main body that has a resistivity within the pre-anneal wafer resistivity target range. For example, in p-type doping regimes using boron as a dopant, due to the segregation coefficient of boron, the resistivity of the melt may decrease in time due to build-up of boron in the melt. By modeling the dopant profile, a counter-doping schedule may be determined. In some embodiments (e.g., interposer applications), the counter-doping schedule comprises adding an amount of n-type dopant such as phosphorous to the melt during ingot growth to compensate for boron build-up. For example, phosphorous may be added in one, two, three, four, or five cycles or more during ingot growth. The model used to determine the counter-doping schedule may be based on known relationships between dopant amounts and resistivity. The resistivity is related to the concentration of the dopant element by $$\text{resistivity}=1/(nqu) \qquad \text{(Eq. 1)}$$

where n is the number of charge carriers, q is the fundamental coulombic charge, and u is the mobility of the charge carrier. Typically, the dopant is considered to be fully ionized, and n can be taken as equal to the concentration of the dopant of interest.

As multiple elements can be present as donors or acceptors, a net majority of carriers can be calculated as an absolute value as $$n_{net}=|n_{donors}-n_{acceptors}| \qquad \text{(Eq. 2).}$$

If the number of donors exceeds the number of acceptors, then the resistivity may be calculated as $$\text{Resistivity}=(n_{net}qu_{e'}) \qquad \text{(Eq. 3)}$$

where $u_{e'}$ is the mobility of electrons. Conversely, if the number of donors is less than the number of acceptors, then the resistivity may be calculated as $$\text{Resistivity}=1/(n_{net}qu_{h}^{\circ}) \qquad \text{(Eq. 4)}$$

where $u_h^{\circ}$ is the mobility of holes.

Inputs 310 into the model to determine the counter-doping schedule may include the amount of main or "first" dopant (e.g., boron) in the melt, melt impurities (e.g., background impurities from the charge), initial silicon charge, chosen counter-dopant, counter-dopant feed amounts (e.g., as a function of body length), top and taper weights, and main body diameter.

The model used in step 200 to determine the amount of thermal donors generated during the subsequent anneal and/or the change in resistivity during the anneal and the model used in step 300 to determine the dopant profile of the melt during ingot growth and to determine a counter-doping schedule may each be executed by a computing system such as a computer system including a processor and a memory.

As used herein, a processor may include any programmable system including systems using micro-controllers, reduced instruction set circuits (RISC), application-specific integrated circuits (ASICs), logic circuits, and any other circuit or processor capable of executing the functions described herein. The above examples are example only, and are thus not intended to limit in any way the definition and/or meaning of the term "processor."

A database related to the model may be stored in the memory. As used herein, the term "database" may refer to either a body of data, a relational database management system (RDBMS), or to both. As used herein, a database may include any collection of data including hierarchical databases, relational databases, flat file databases, object-relational databases, object oriented databases, and any other structured collection of records or data that is stored in a computer system. The above examples are example only, and thus are not intended to limit in any way the definition and/or meaning of the term database. Examples of RDBMS' include, but are not limited to including, Oracle® Database, MySQL, IBM® DB2, Microsoft® SQL Server, Sybase®, and PostgreSQL. However, any database may be used that enables the systems and methods described herein. (Oracle is a registered trademark of Oracle Corporation, Redwood Shores, California; IBM is a registered trademark of International Business Machines Corporation, Armonk, New York; Microsoft is a registered trademark of Microsoft Corporation, Redmond, Washington; and Sybase is a registered trademark of Sybase, Dublin, California.)

In another embodiment, a computer program is provided, and the program is embodied on a computer-readable medium. In an example embodiment, the system is executed on a single computer system, without requiring a connection to a server computer. In a further example embodiment, the system is being run in a Windows® environment (Windows is a registered trademark of Microsoft Corporation, Redmond, Washington). In yet another embodiment, the system is run on a mainframe environment and a UNIX® server environment (UNIX is a registered trademark of X/Open Company Limited located in Reading, Berkshire, United Kingdom). In a further embodiment, the system is run on an iOS® environment (iOS is a registered trademark of Cisco Systems, Inc. located in San Jose, CA). In yet a further embodiment, the system is run on a Mac OS® environment (Mac OS is a registered trademark of Apple Inc. located in Cupertino, CA). In still yet a further embodiment, the system is run on Android® OS (Android is a registered trademark of Google, Inc. of Mountain View, CA). In another embodiment, the system is run on Linux® OS (Linux is a registered trademark of Linus Torvalds of Boston, MA). The application is flexible and designed to run in various different environments without compromising any major functionality. In some embodiments, the system includes multiple components distributed among a plurality of computing devices. One or more components are in the form of computer-executable instructions embodied in a computer-readable medium. The systems and processes are not limited to the specific embodiments described herein. In addition, components of each system and each process can be practiced independently and separately from other components and processes described herein. Each component and process can also be used in combination with other assembly packages and processes.

The systems and processes are not limited to the specific embodiments described herein. In addition, components of each system and each process can be practiced independent and separate from other components and processes described herein. Each component and process also can be used in combination with other assembly packages and processes.

Figure 3:
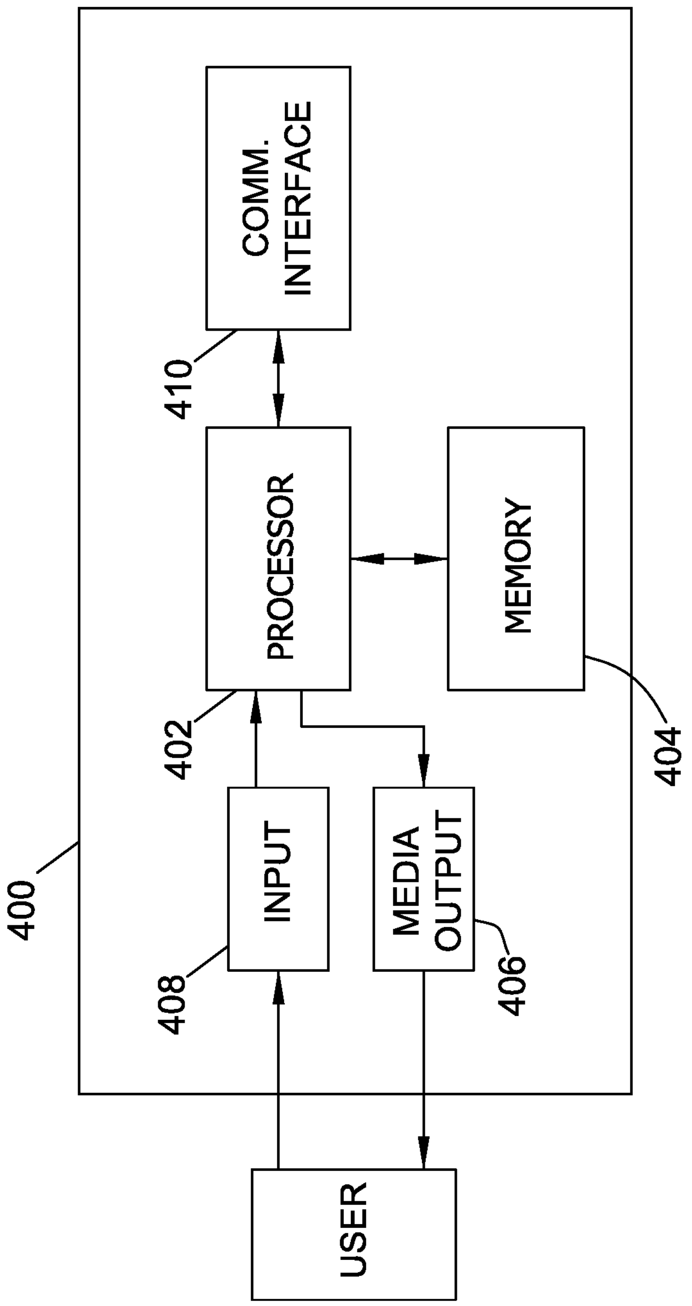
FIG. 3 is a block diagram of a computing device for use in the method of FIG. 1.
Figure 4:
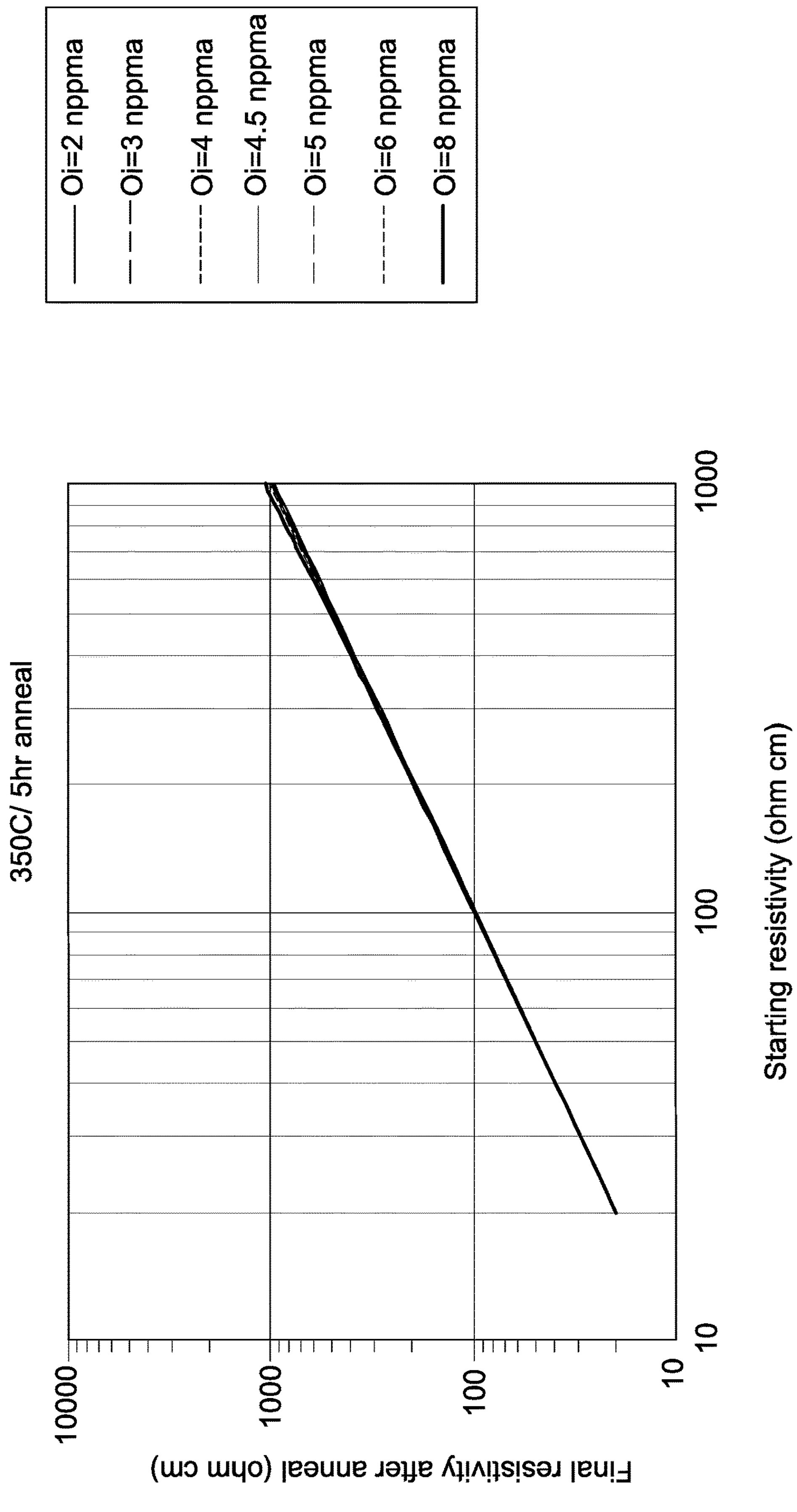
FIG. 4 is a graph showing the final resistivity as a function of starting resistivity for a five hour 350° C. anneal for wafers having various oxygen concentrations.
Figure 5:
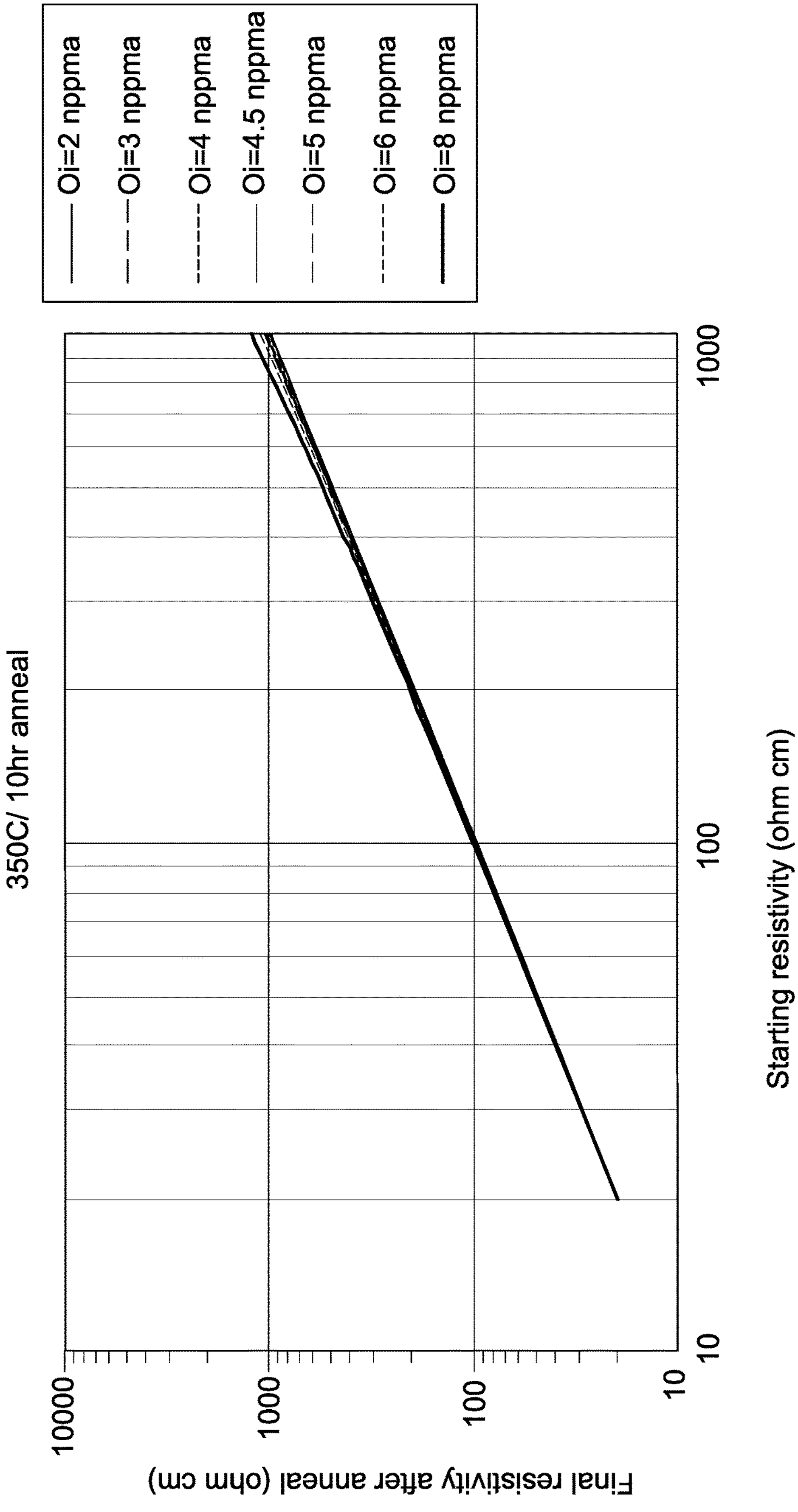
FIG. 5 is a graph showing the final resistivity as a function of starting resistivity for a ten hour 350° C. anneal for wafers having various oxygen concentrations.
Figure 6:
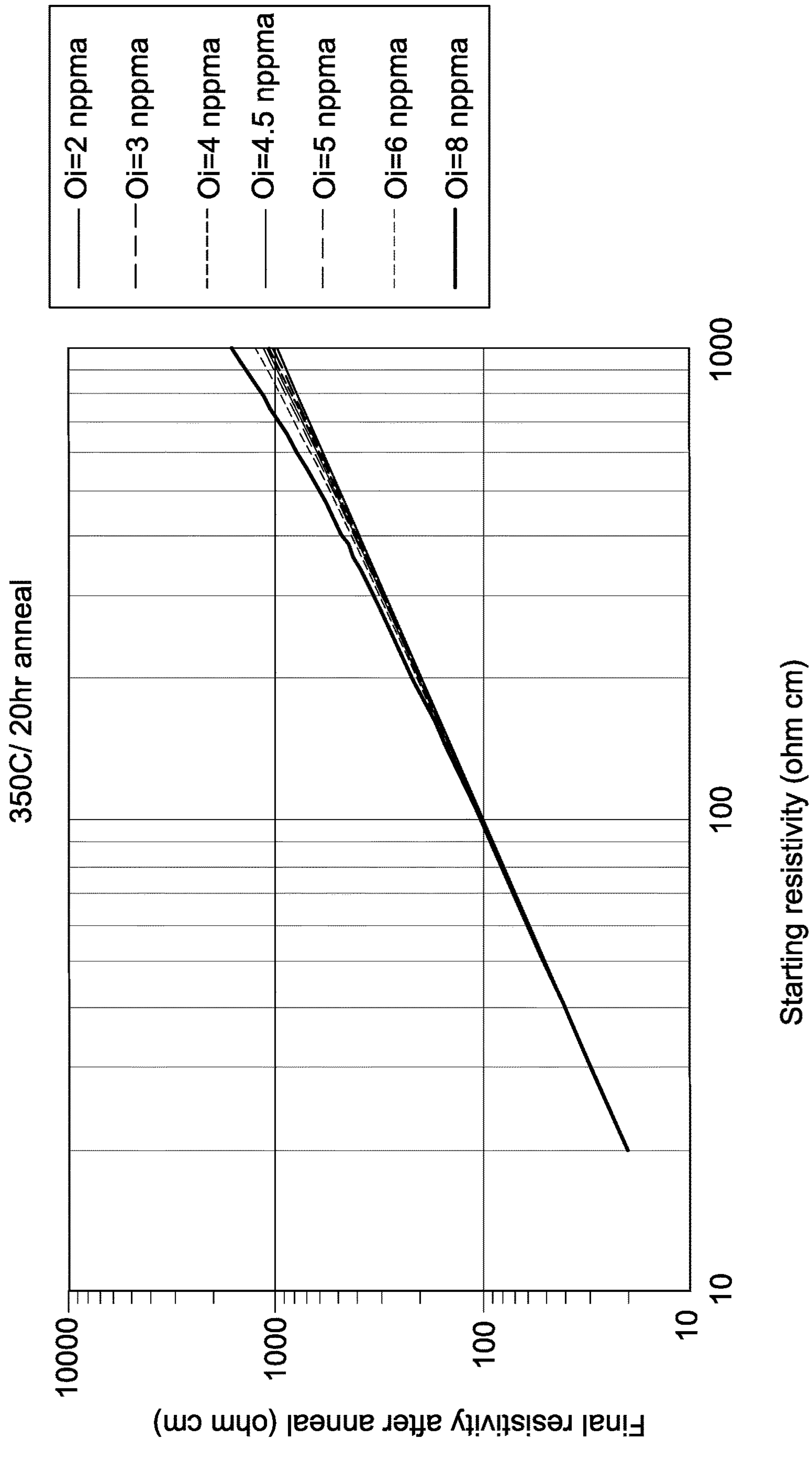
FIG. 6 is a graph showing the final resistivity as a function of starting resistivity for a twenty hour 350° C. anneal for wafers having various oxygen concentrations.

In some embodiments, each model used in steps 200, 300 (FIG. 1) is executed on an example computing device 400 (FIG. 3). The computing device 400 includes a processor 402, a memory 404, a media output component 406, an input device 408, and a communications interface 410. Other embodiments include different components, additional components, and/or do not include all components shown in FIG. 3. The computing device 400 may be used, for example, to receive and process data (for example, inputs 210, 310 described herein), to perform thermal donor and/or crystal growth simulations.

The processor 402 is configured for executing instructions. In some embodiments, executable instructions are stored in the memory 404. The processor 402 may include one or more processing units (e.g., in a multi-core configuration). The term processor, as used herein, refers to central processing units, microprocessors, microcontrollers, reduced instruction set circuits (RISC), application specific integrated circuits (ASIC), a programmable logic circuit (PLC), and any other circuit or processor capable of executing the functions described herein. The above are examples only, and are thus not intended to limit in any way the definition and/or meaning of the term "processor."

The memory 404 stores non-transitory, computer-readable instructions for performance of the techniques described herein. Such instructions, when executed by the processor 402, cause the processor 402 to perform at least a portion of the methods described herein. In some embodiments, the memory 404 stores computer-readable instructions for providing a user interface to the user via media output component 406 and, receiving and processing input from input device 408. The memory 404 may include, but is not limited to, random access memory (RAM) such as dynamic RAM (DRAM) or static RAM (SRAM), read-only memory (ROM), erasable programmable read-only memory (EPROM), electrically erasable programmable read-only memory (EEPROM), and non-volatile RAM (NVRAM). Although illustrated as separate from the processor 402, in some embodiments the memory 404 is combined with the processor 402, such as in a microcontroller or microprocessor, but may still be referred to separately. The above memory types are example only, and are thus not limiting as to the types of memory usable for storage of a computer program.

The media output component 406 is configured for presenting information to the user (e.g., the operator of the device). The media output component 406 is any component capable of conveying information to the user. In some embodiments, the media output component 406 includes an output adapter such as a video adapter and/or an audio adapter. The output adapter is operatively connected to the processor 402 and operatively connectable to an output device such as a display device (e.g., a liquid crystal display (LCD), light emitting diode (LED) display, organic light emitting diode (OLED) display, cathode ray tube (CRT), "electronic ink" display, one or more light emitting diodes (LEDs)) or an audio output device (e.g., a speaker or headphones).

The computing device 400 includes, or is connected to, the input device 408 for receiving input from the user (e.g., input 210, 310 shown in FIG. 1). The input device 408 is any device that permits the computing device 400 to receive analog and/or digital commands, instructions, or other inputs from the user, including visual, audio, touch, button presses, stylus taps, etc. The input device 408 may include, for example, a variable resistor, an input dial, a keyboard/keypad, a pointing device, a mouse, a stylus, a touch sensitive panel (e.g., a touch pad or a touch screen), a gyroscope, an accelerometer, a position detector, an audio input device, or any combination thereof. A single component such as a touch screen may function as both an output device of the media output component 406 and the input device 408.

The communication interface enables the computing device 400 to communicate with remote devices and systems, such as remote sensors, remote databases, remote computing devices, and the like, and may include more than one communication interface for interacting with more than one remote device or system. The communication interfaces may be wired or wireless communications interfaces that permit the computing device 400 to communicate with the remote devices and systems directly or via a network. Wireless communication interfaces may include a radio frequency (RF) transceiver, a Bluetooth® adapter, a Wi-Fi transceiver, a ZigBee® transceiver, a near field communication (NFC) transceiver, an infrared (IR) transceiver, and/or any other device and communication protocol for wireless communication. (Bluetooth is a registered trademark of Bluetooth Special Interest Group of Kirkland, Washington; ZigBee is a registered trademark of the ZigBee Alliance of San Ramon, California) Wired communication interfaces may use any suitable wired communication protocol for direct communication including, without limitation, USB, RS232, I2C, SPI, analog, and proprietary I/O protocols. In some embodiments, the wired communication interfaces include a wired network adapter allowing the computing device 400 to be coupled to a network, such as the Internet, a local area network (LAN), a wide area network (WAN), a mesh network, and/or any other network to communicate with remote devices and systems via the network.

The computer systems discussed herein may include additional, less, or alternate functionality, including that discussed elsewhere herein. The computer systems discussed herein may include or be implemented via computer-executable instructions stored on non-transitory computer-readable media or medium.

In an example embodiment for executing step 200, the computer device 400 includes a model (e.g., simulation) of the resistivity change due to thermal donor formation for a range of anneal temperatures and lengths. In an example embodiment for executing step 300, the computer device 400 includes a model (e.g., simulation) of the resistivity of an ingot formed from a silicon melt based on an initial doping amount (e.g., p-type such as boron) and/or with various counter-doping amounts.

Figure 2:
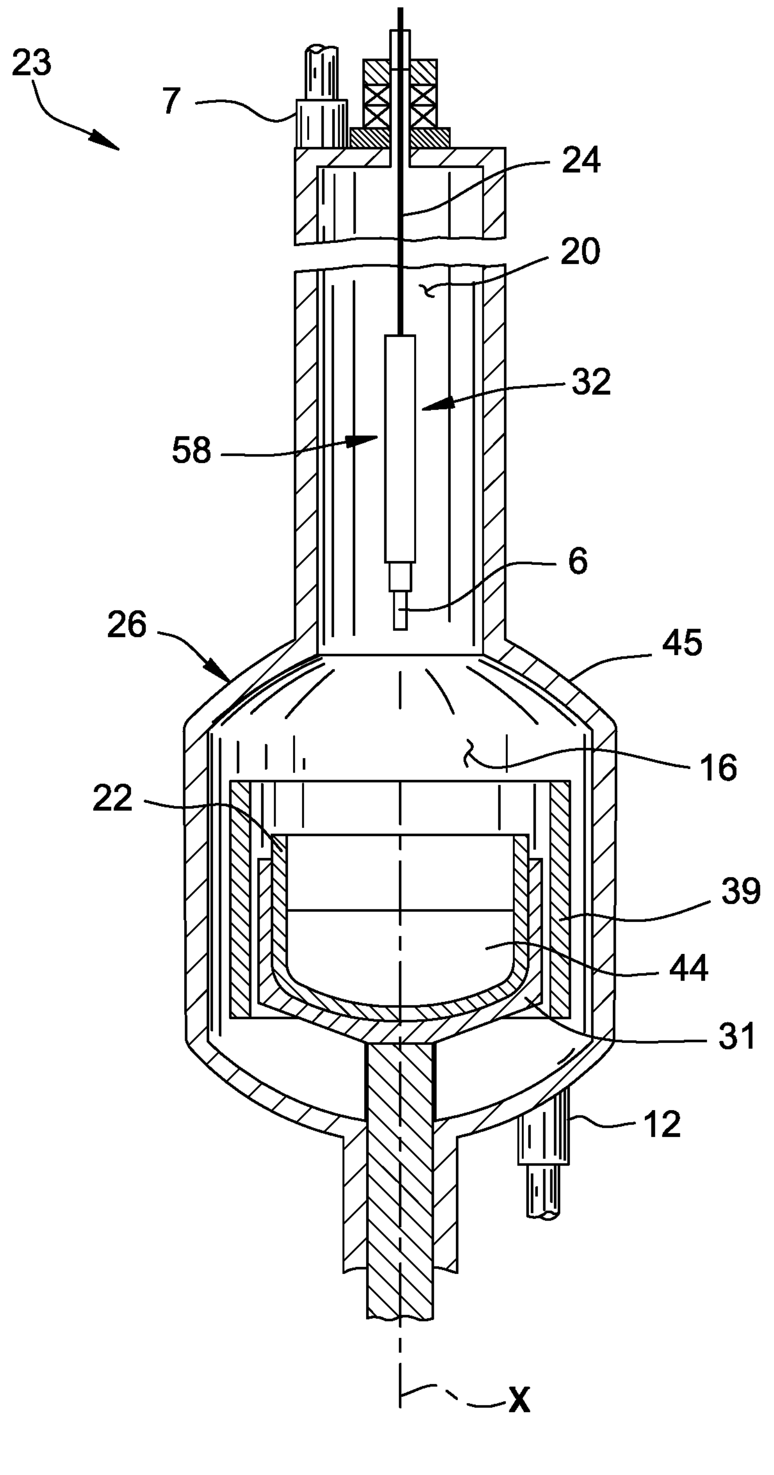
FIG. 2 is a schematic side view of a pulling apparatus for forming a single crystal silicon ingot.

Once the counter-doping schedule is determined, in step 400 an ingot may be grown according to the counter-doping schedule. In accordance with embodiments of the present disclosure and with reference to FIG. 2, the ingot is grown by the so-called Czochralski process in which the ingot is withdrawn from a silicon melt 44 held within a crucible 22 of an ingot puller 23.

The ingot puller 23 includes a housing 26 that defines a crystal growth chamber 16 and a pull chamber 20 having a smaller transverse dimension than the growth chamber. The growth chamber 16 has a generally dome shaped upper wall 45 transitioning from the growth chamber 16 to the narrowed pull chamber 20. The ingot puller 23 includes an inlet port 7 and an outlet port 12 which may be used to introduce and remove a process gas to and from the housing 26 during crystal growth.

The crucible 22 within the ingot puller 23 contains the silicon melt 44 from which a silicon ingot is drawn. The silicon melt 44 is obtained by melting polycrystalline silicon charged to the crucible 22. The crucible 22 is mounted on a turntable 31 for rotation of the crucible about a central longitudinal axis X of the ingot puller 23.

A heating system 39 (e.g., an electrical resistance heater 39) surrounds the crucible 22 for melting the silicon charge to produce the melt 44. The heater 39 may also extend below the crucible as shown in U.S. Patent No. 8, 317, 919. The heater 39 is controlled by a control system (not shown) so that the temperature of the melt 44 is precisely controlled throughout the pulling process. Insulation (not shown) surrounding the heater 39 may reduce the amount of heat lost through the housing 26. The ingot puller 23 may also include a heat shield assembly (not shown) above the melt surface for shielding the ingot from the heat of the crucible 22 to increase the axial temperature gradient at the solid-melt interface.

A pulling mechanism (not shown) is attached to a pull wire 24 that extends down from the mechanism. The mechanism is capable of raising and lowering the pull wire 24. The ingot puller 23 may have a pull shaft rather than a wire, depending upon the type of puller. The pull wire 24 terminates in a pulling assembly 58 that includes a seed crystal chuck 32 which holds a seed crystal 6 used to grow the silicon ingot. In growing the ingot, the pulling mechanism lowers the seed crystal 6 until it contacts the surface of the silicon melt 44. Once the seed crystal 6 begins to melt, the pulling mechanism slowly raises the seed crystal up through the growth chamber 16 and pull chamber 20 to grow the monocrystalline ingot. The speed at which the pulling mechanism rotates the seed crystal 6 and the speed at which the pulling mechanism raises the seed crystal (i.e., the pull rate v) are controlled by the control system.

A process gas is introduced through the inlet port 7 into the housing 26 and is withdrawn from the outlet port 12. The process gas creates an atmosphere within the housing and the melt and atmosphere form a melt-gas interface. The outlet port 12 is in fluid communication with an exhaust system (not shown) of the ingot puller.

In this regard, the ingot puller 23 shown in FIG. 1 and described herein is exemplary and other crystal puller configurations and arrangements may be used to pull a single crystal silicon ingot from a melt unless stated otherwise.

In accordance with embodiments of the present disclosure, polycrystalline silicon is added to the crucible 22. The polycrystalline silicon is heated to cause silicon to liquefy and form a melt in the crucible. A dopant (e.g., p-type such as boron) is added to the crucible (before or after melting of the polycrystalline silicon).

While the methods of the present disclosure have been described with reference to the first dopant being a p-type dopant (e.g., boron but also gallium, aluminum or indium) and the counter-dopant or "second" dopant being an n-type dopant (e.g., phosphorous but also antimony or arsenic), in other embodiments, the main dopant may be one or more n-type dopants and the counter-dopant may be a p-type dopant (i.e., the first dopant is p-type or n-type and the second dopant is a type different from the type of the first dopant). When phosphorous is added, any suitable source of phosphorous may be used.

By counter-doping to achieve the desired pre-anneal resistivity, the length of the constant diameter portion or "main body" of the ingot that is within the target pre-anneal resistivity range (i.e., "prime" portion) may be increased. For example, at least 50% of the length of the constant diameter portion may be within the pre-anneal wafer resistivity target range or at least 60%, at least 70%, at least 80%, at least 90%, at least 95% or the entire constant diameter portion of the ingot is within the pre-anneal wafer resistivity target range.

In some embodiments, after the ingot is grown, wafers are sliced from the portion of the ingot within the pre-anneal wafer resistivity target range. Devices such as interposer devices are built upon the wafers with the heat treatments described above being performed as part of the device fabrication process. The device may be any device in which thermal donors form as part of the device fabrication process. In some embodiments, the device is an interposer. In some embodiments, the device is any device that includes a through-silicon via connection (TSV).

Compared to conventional methods for forming ingots, the methods of present disclosure have several advantages. By modeling the change in resistivity caused by downstream anneals, a pre-anneal target resistivity range may be determined. This allows a counter-doping schedule to be developed to increase the prime portion of the ingot. This allows the ingot process to be tuned based on the subsequent anneal temperature and duration. This is particularly advantageous for substrates used for interposer devices because interposer devices are prepared by methods that involve relatively long anneals (e.g., 5 to 40 hours) at a range of temperatures which allow thermal donors to form (e.g., 350 to 500° C.). The method allows customers to better define ingot growth specification ranges for improved in-line performance and allows back-end line performance to be coupled to wafer integration.

EXAMPLES

The processes of the present disclosure are further illustrated by the following Examples. These Examples should not be viewed in a limiting sense.

Example 1: Thermal Donor Impact on Final Resistivity

Figure 7:
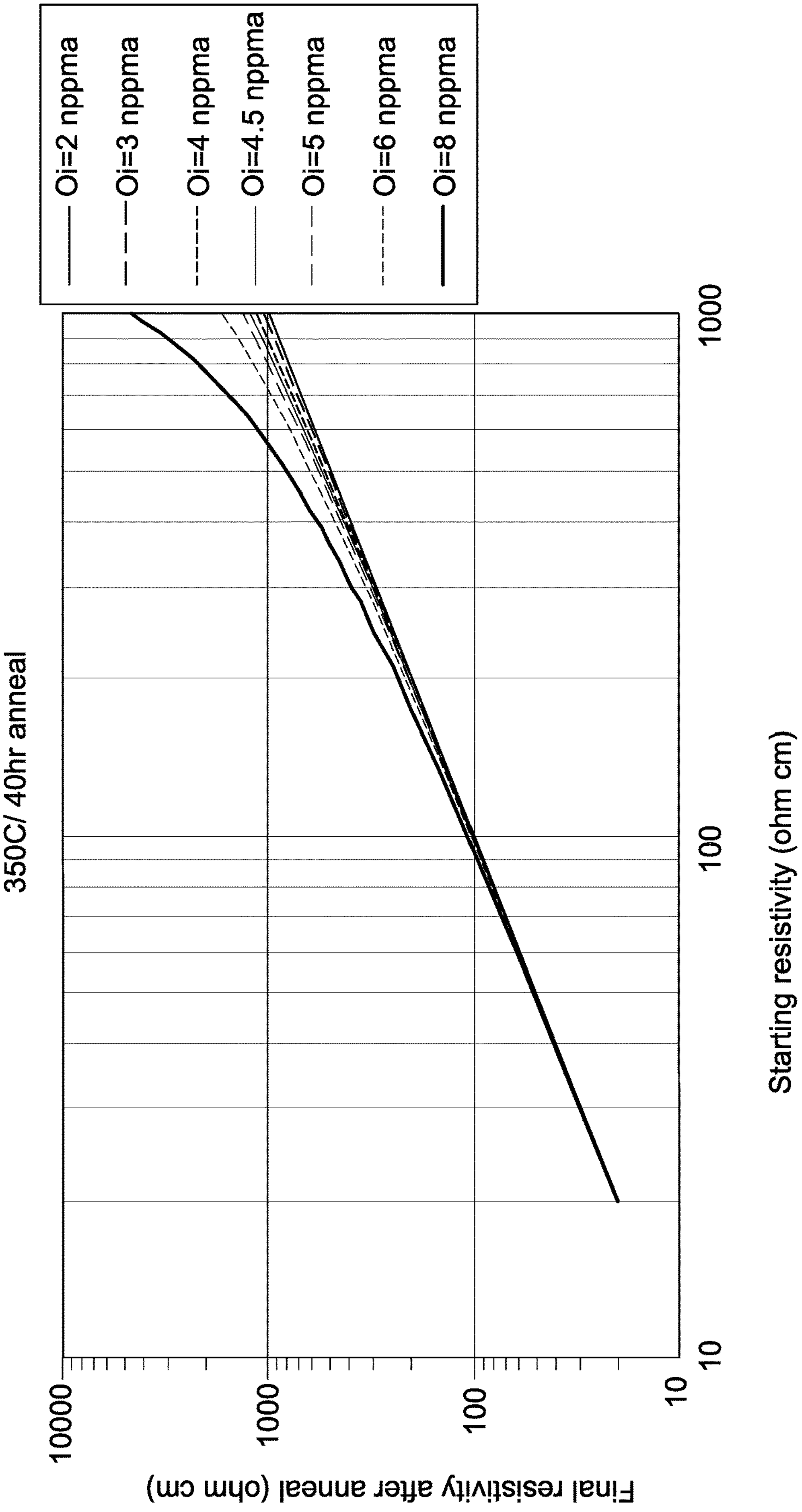
FIG. 7 is a graph showing the final resistivity as a function of starting resistivity for a forty hour 350° C. anneal for wafers having various oxygen concentrations.
Figure 8:
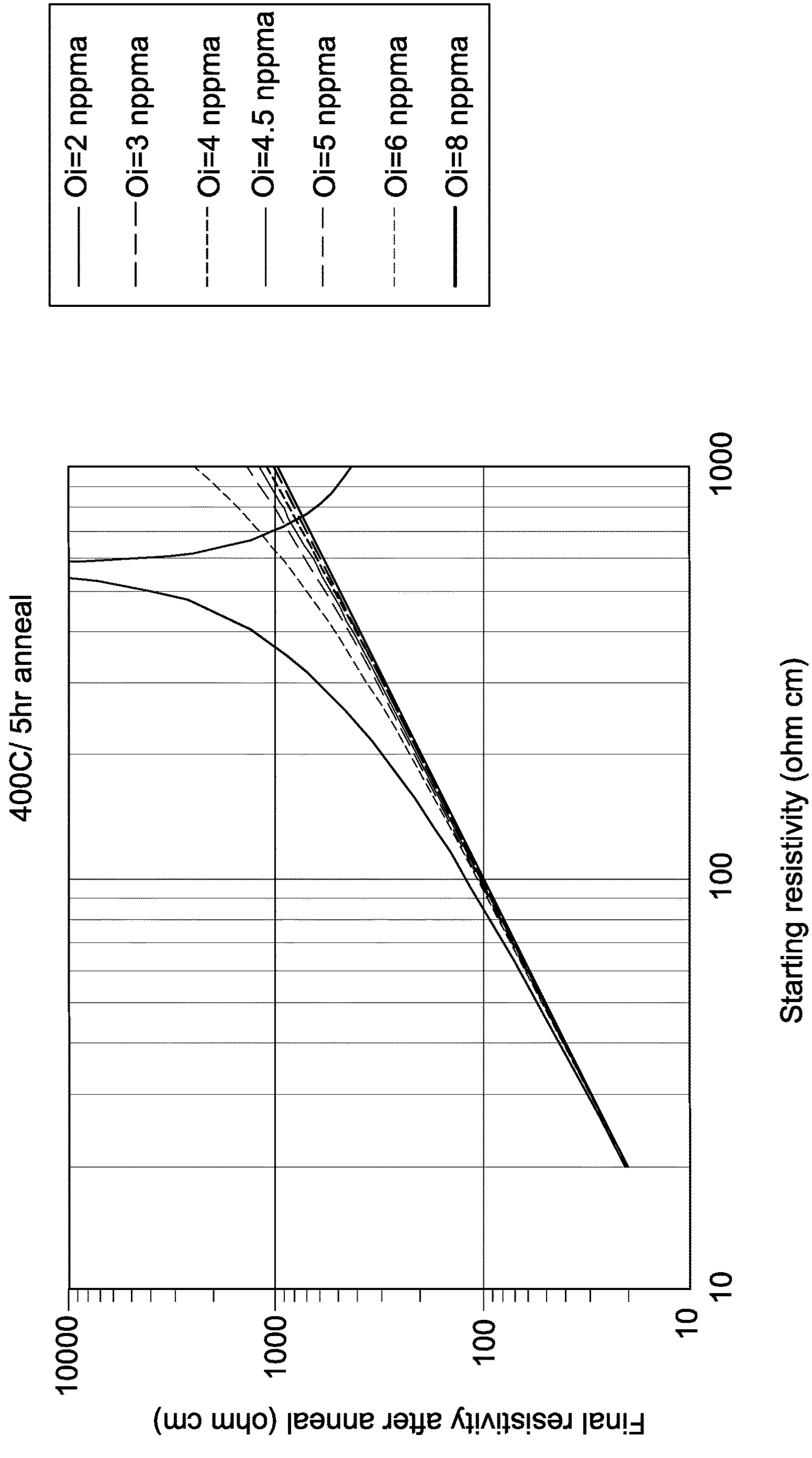
FIG. 8 is a graph showing the final resistivity as a function of starting resistivity for a five hour 400° C. anneal for wafers having various oxygen concentrations.
Figure 9:
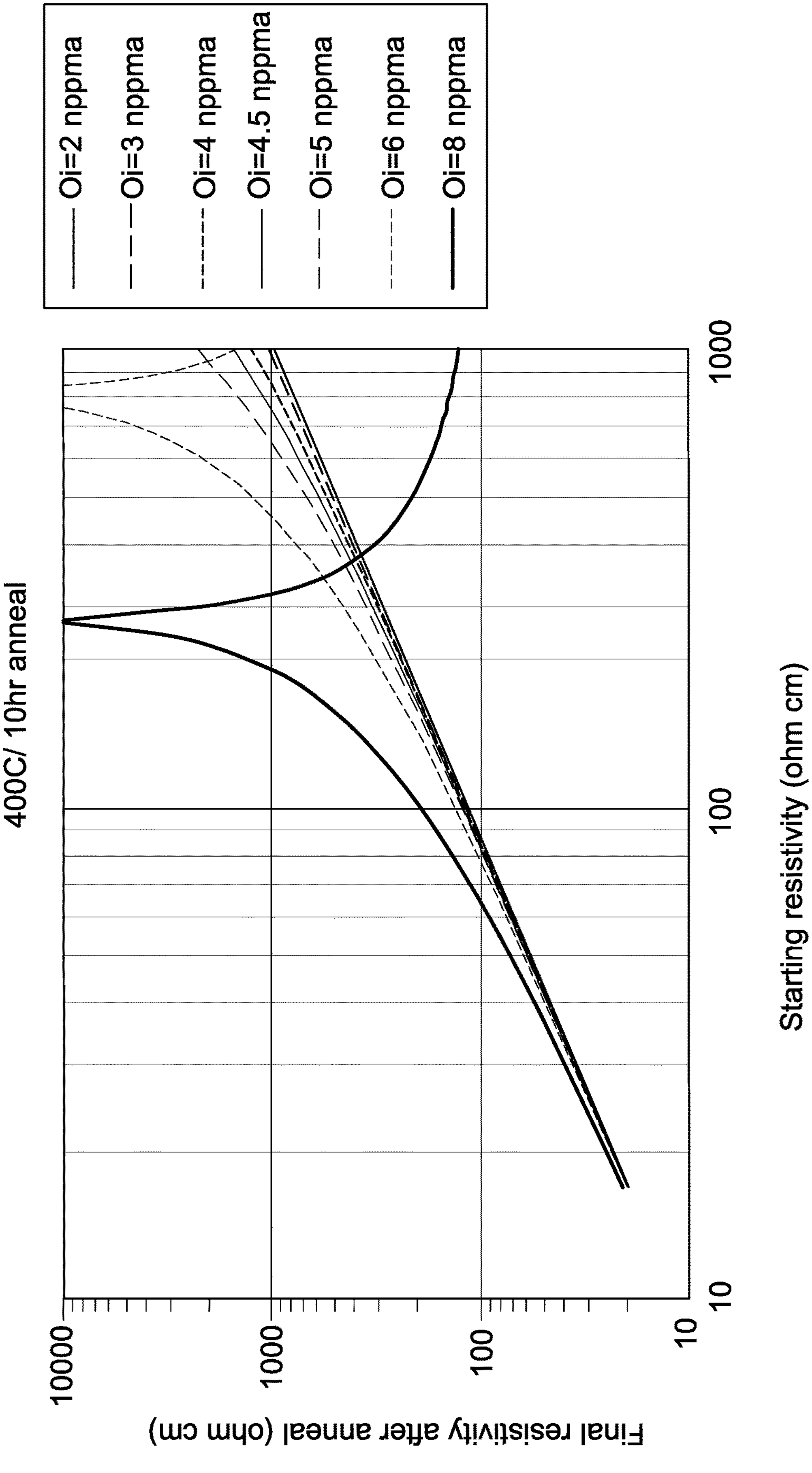
FIG. 9 is a graph showing the final resistivity as a function of starting resistivity for a ten hour 400° C. anneal for wafers having various oxygen concentrations.
Figure 10:
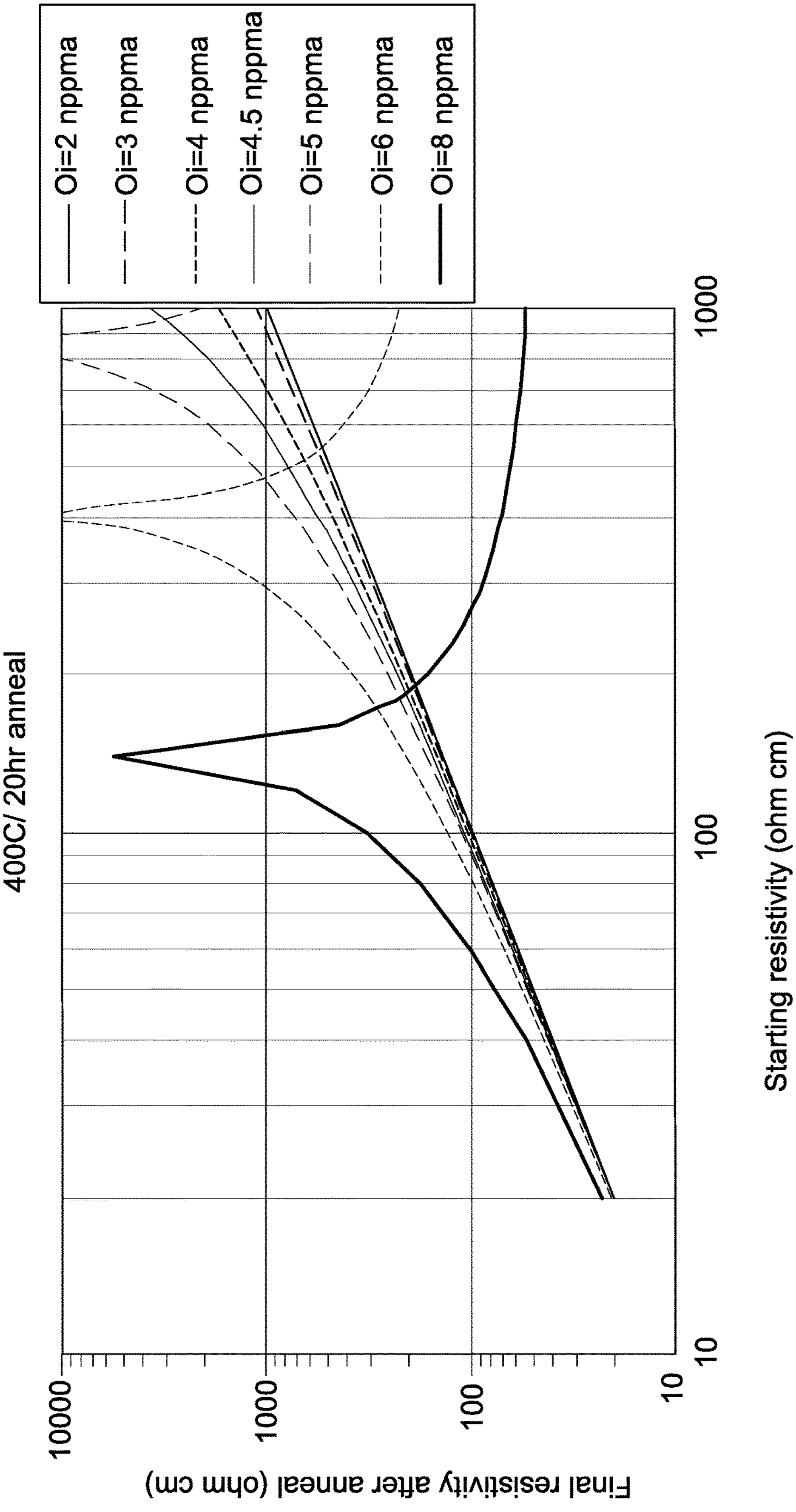
FIG. 10 is a graph showing the final resistivity as a function of starting resistivity for a twenty hour 400° C. anneal for wafers having various oxygen concentrations.
Figure 11:
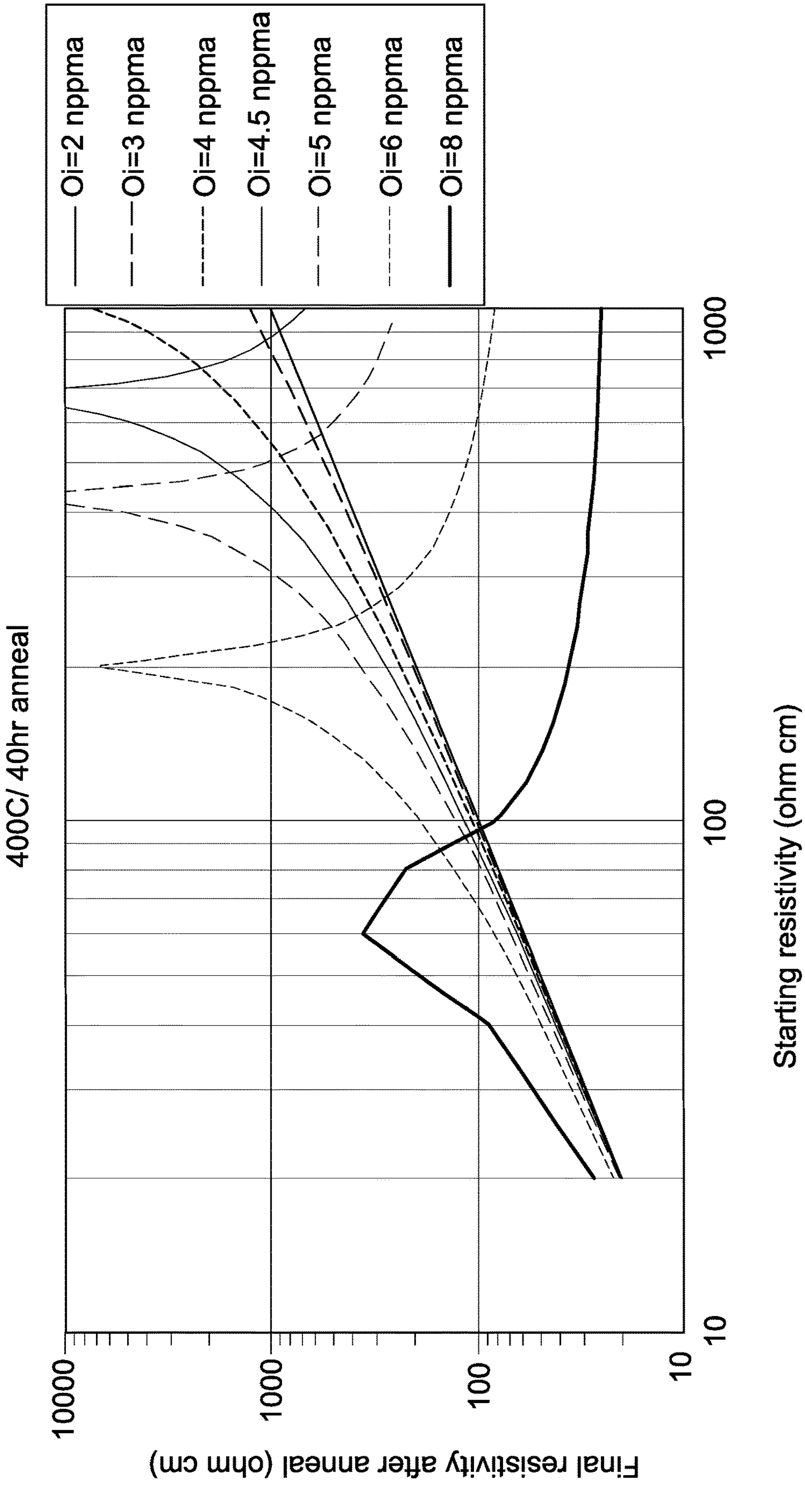
FIG. 11 is a graph showing the final resistivity as a function of starting resistivity for a forty hour 400° C. anneal for wafers having various oxygen concentrations.
Figure 12:
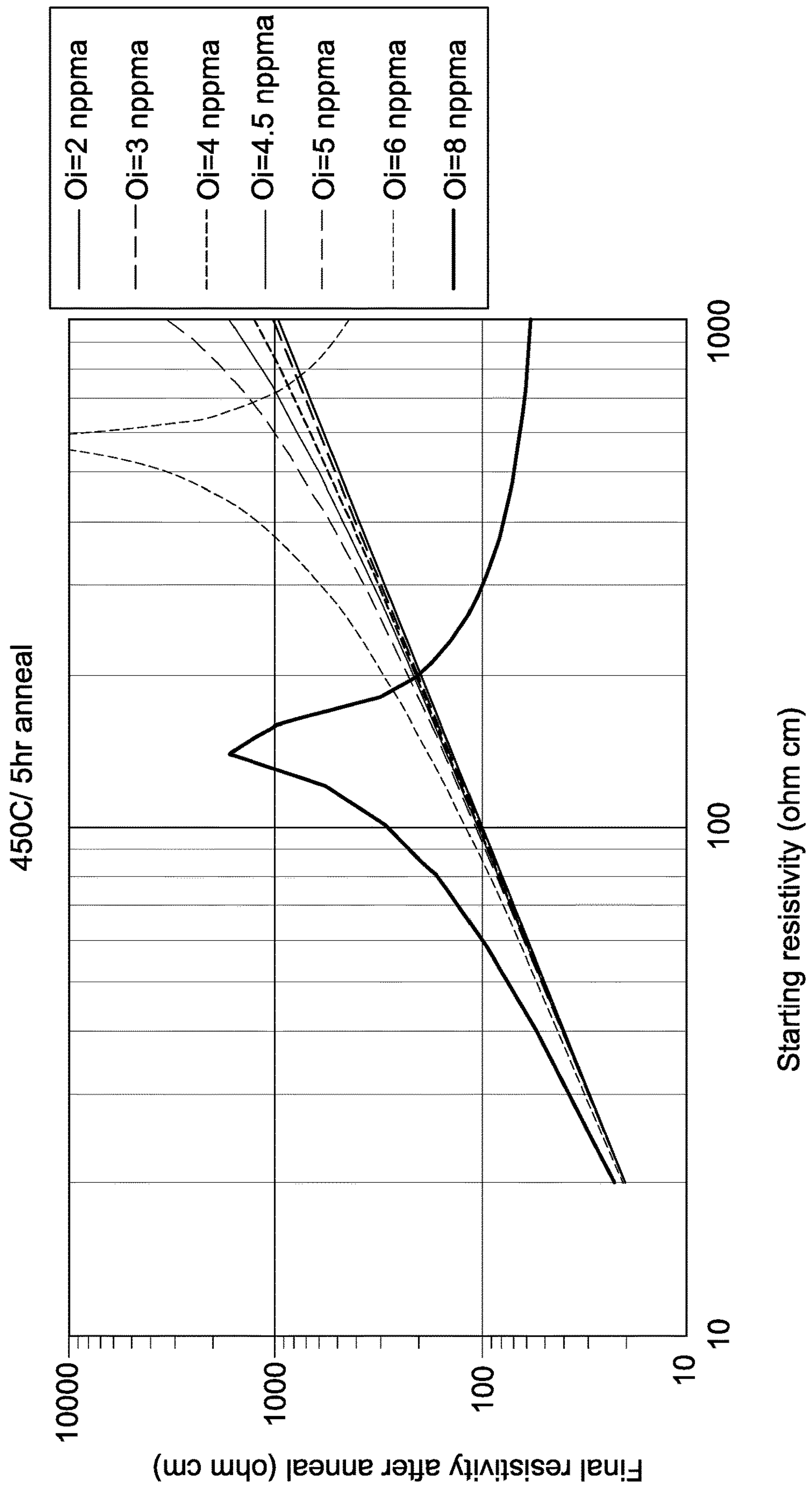
FIG. 12 is a graph showing the final resistivity as a function of starting resistivity for a five hour 450° C. anneal for wafers having various oxygen concentrations.
Figure 13:
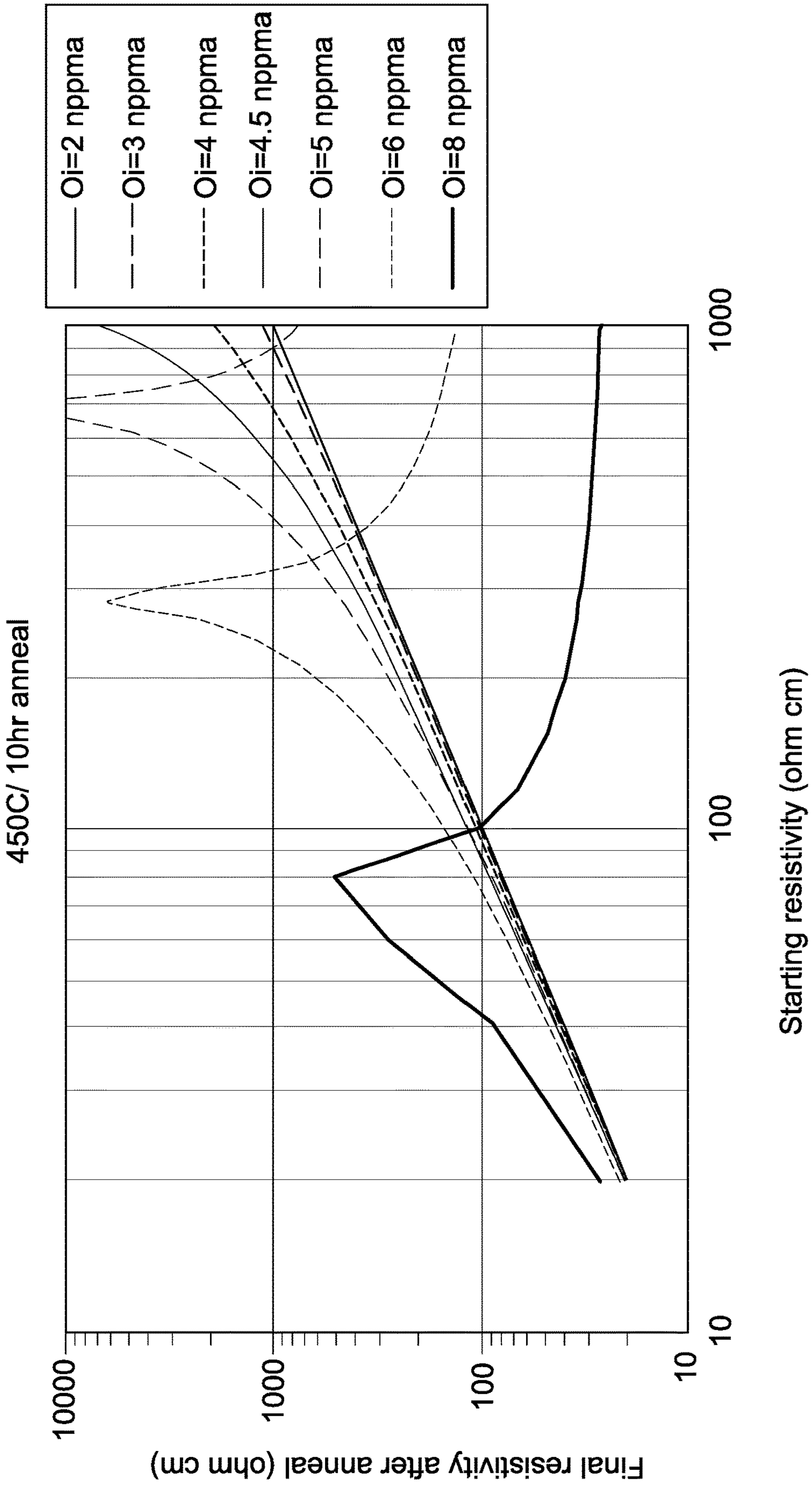
FIG. 13 is a graph showing the final resistivity as a function of starting resistivity for a ten hour 450° C. anneal for wafers having various oxygen concentrations.
Figure 14:
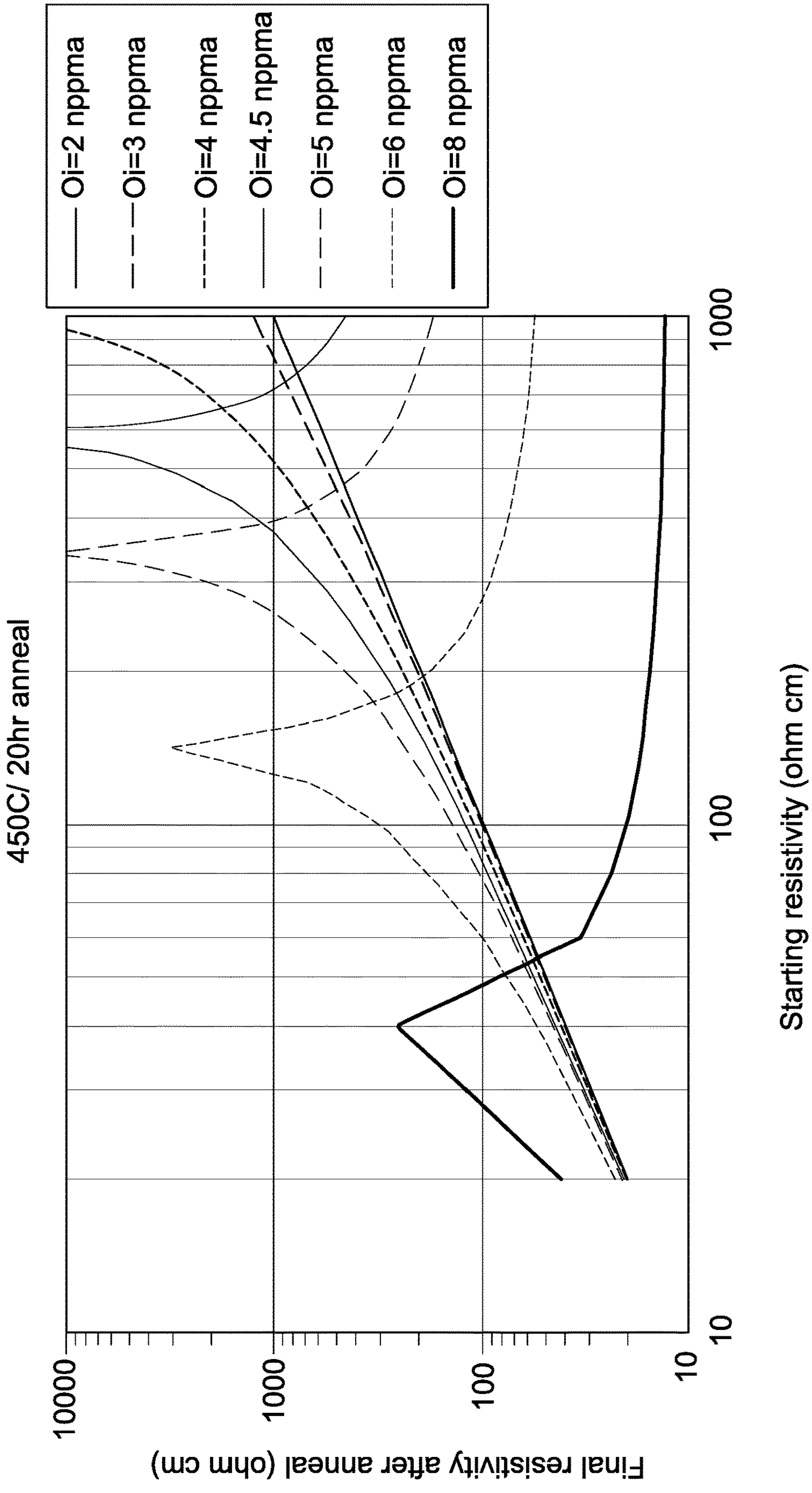
FIG. 14 is a graph showing the final resistivity as a function of starting resistivity for a twenty hour 450° C. anneal for wafers having various oxygen concentrations.
Figure 15:
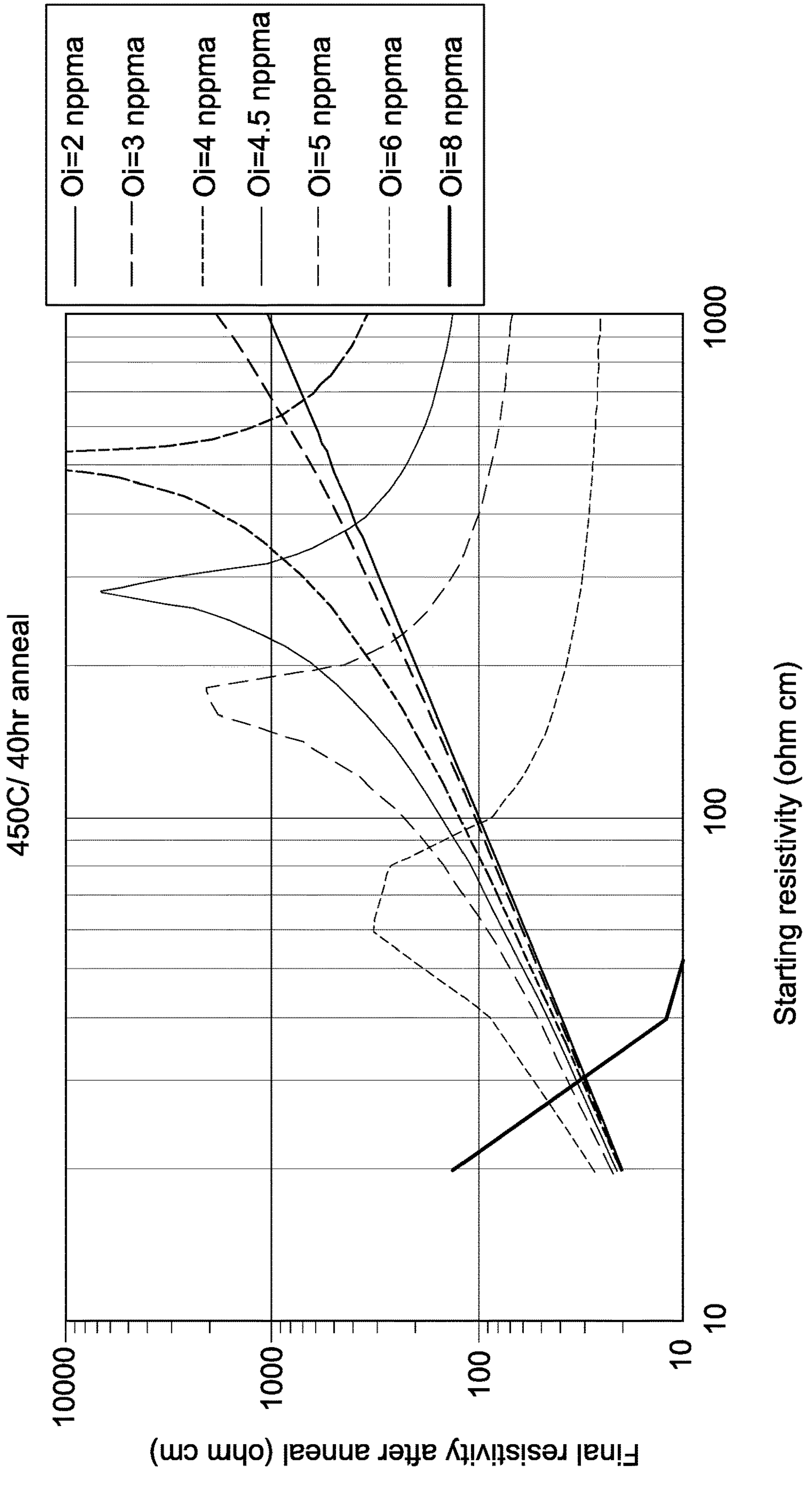
FIG. 15 is a graph showing the final resistivity as a function of starting resistivity for a forty hour 450° C. anneal for wafers having various oxygen concentrations.

FIGS. 4-7 show the impact of a 350° C. thermal anneal on thermal donor generation in p-type (boron) wafers and the resulting resistivity change for given starting resistivities for 5, 10, 20 and 40 hour anneals (each ingot and wafer in Examples 1 and 2 were p-type and doped with boron). As shown in FIGS. 4-7, there is little impact to post anneal resistivity except for higher oxygen wafers (8 nppma) after 40 hours (FIG. 7).

At 400° C. (FIGS. 8-11) more thermal donors are produced which causes some wafers to type-change. Longer anneals cause changes in resistivity for even lower oxygen-content wafers. A target post-anneal resistivity of 300 ohm-cm to 1000 ohm-cm is more constrained at 400° C. (relative to 350° C.) over a wider range of oxygen content. As shown in FIGS. 8-11, the viable starting resistivity is curtailed as oxygen increases above 4 ppma at longer anneal times. In many cases, the final resistivity will not only increase at least 1,000 ohm-cm but will actually type flip. To avoid resistivity increase and type-flip, the usable oxygen window and the starting resistivity window tightens considerably, possibly impacting the length of the prime portion of the ingot main body.

At 450° C. (FIGS. 12-15) even more thermal donors are produced and the process window for starting resistivity and oxygen shrinks even further.

Figure 16:
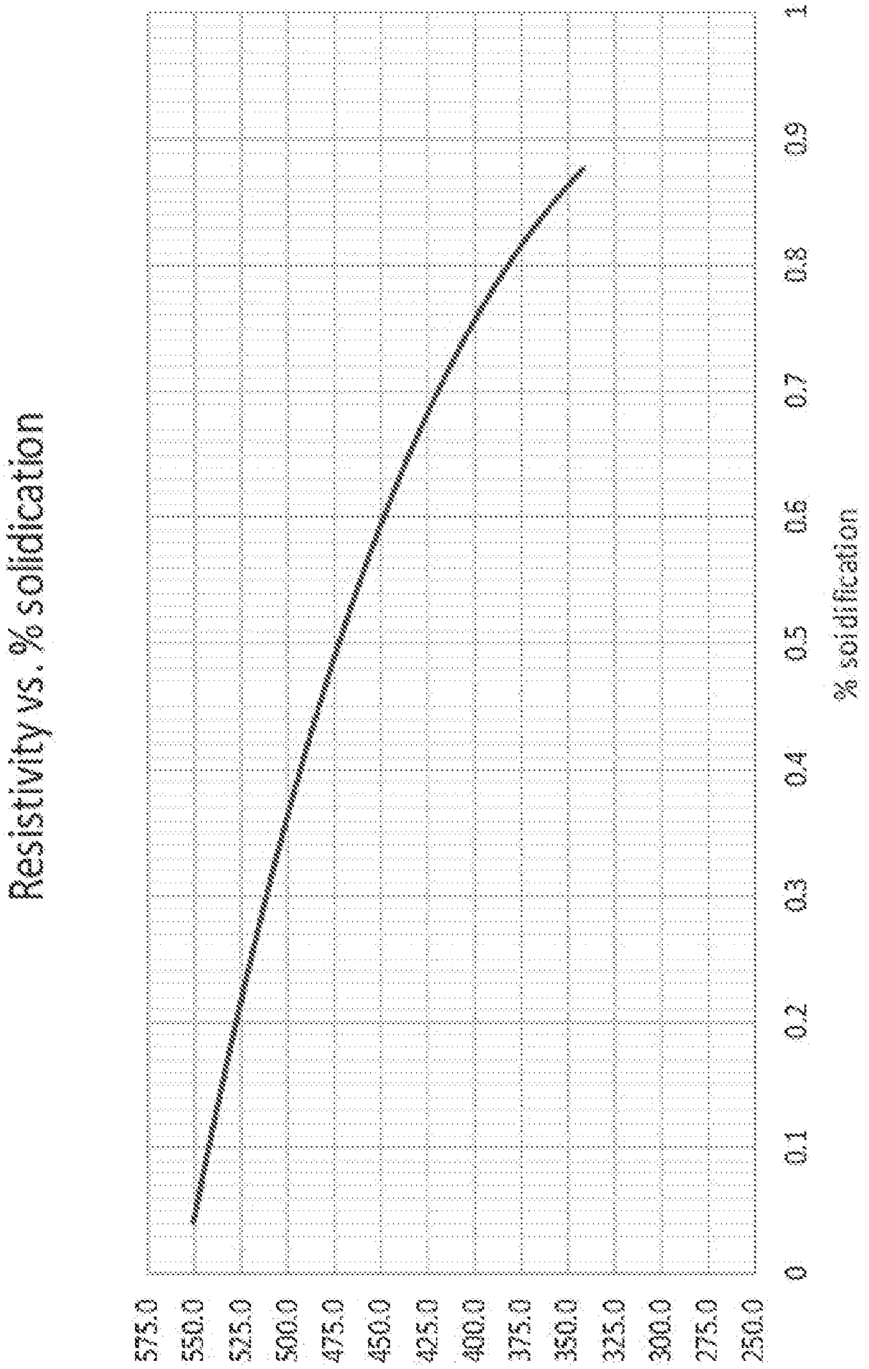
FIG. 16 is a graph showing the change in resistivity (ohm-cm) over the length of the main body of the ingot for a p-type boron-doped ingot.

Example 2: Post-Anneal Resistivity Targets and Crystal Window for Various Oxygen Concentrations and Anneals and Counter-Doping Techniques As shown in FIGS. 4-7, in the case of 350° C., the crystal window is not constrained up to 8 nppma for post anneal (40 hour) resistivity targets of 75-300 ohm-cm but is constrained to ~700 ohm-cm at 6 nppma and to ~550 ohm-cm at 8 nppma for final resistivity targets of 300-1000 ohm-cm. In both cases, if the seed end target is maintained below 550 or 700 ohm-cm, a full body crystal can be grown as shown in FIG. 16.

Figure 17:
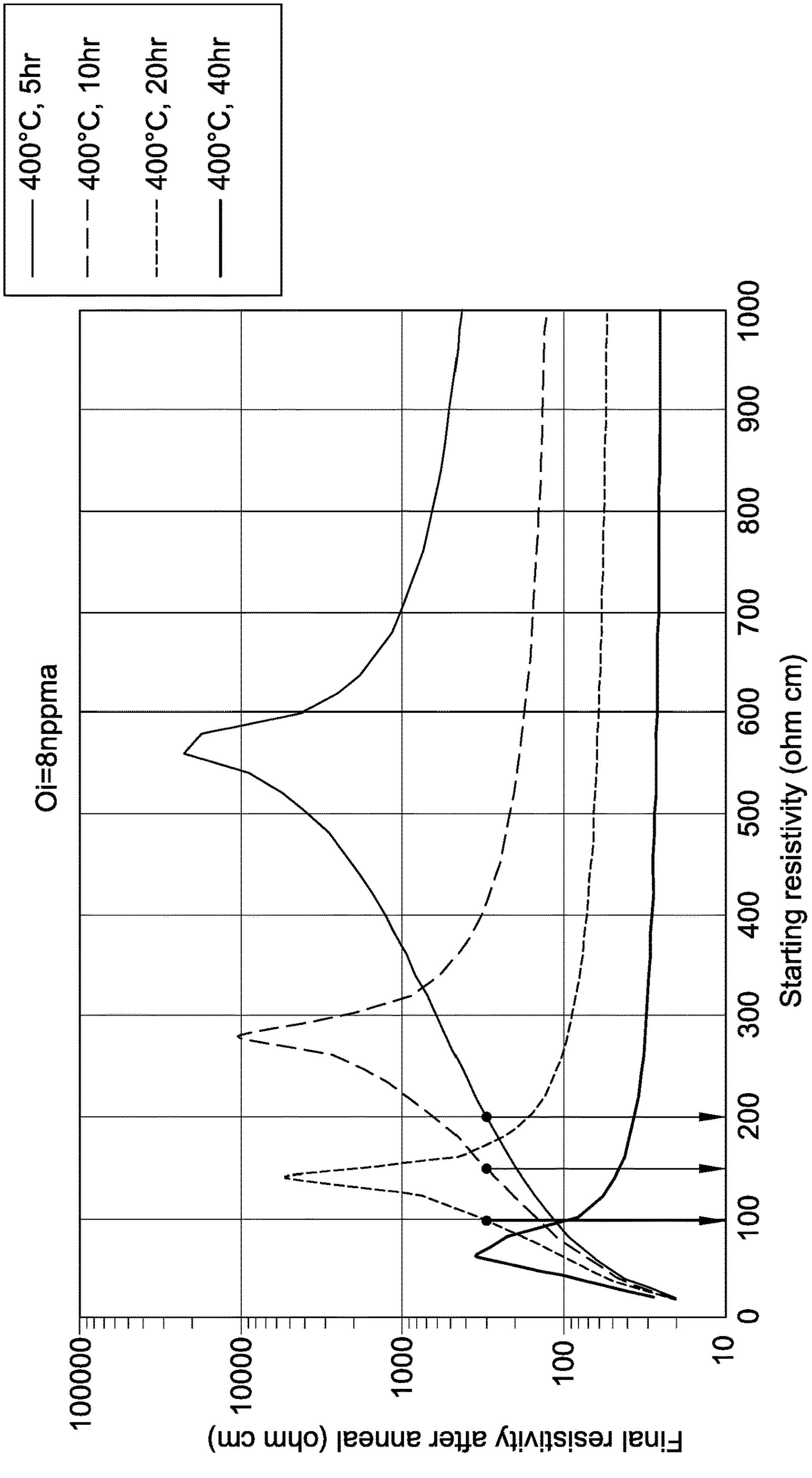
FIG. 17 is a graph showing the final resistivity as a function of starting resistivity for an 8 nppma wafer annealed at 400° C. for 5, 10, 20 and 40 hours.

In the case of 400° C. (FIG. 17), it can be seen that for Oi of 8 nppma, a crystal resistivity upper limit of 75-300 ohm-cm post anneal is ~200 ohm-cm at a 5 hour anneal, ~150 ohm-cm for a 10 hour anneal and ~100 ohm-cm for a 20 hour anneal with essentially no window for a 40 hour anneal.

Figure 18:
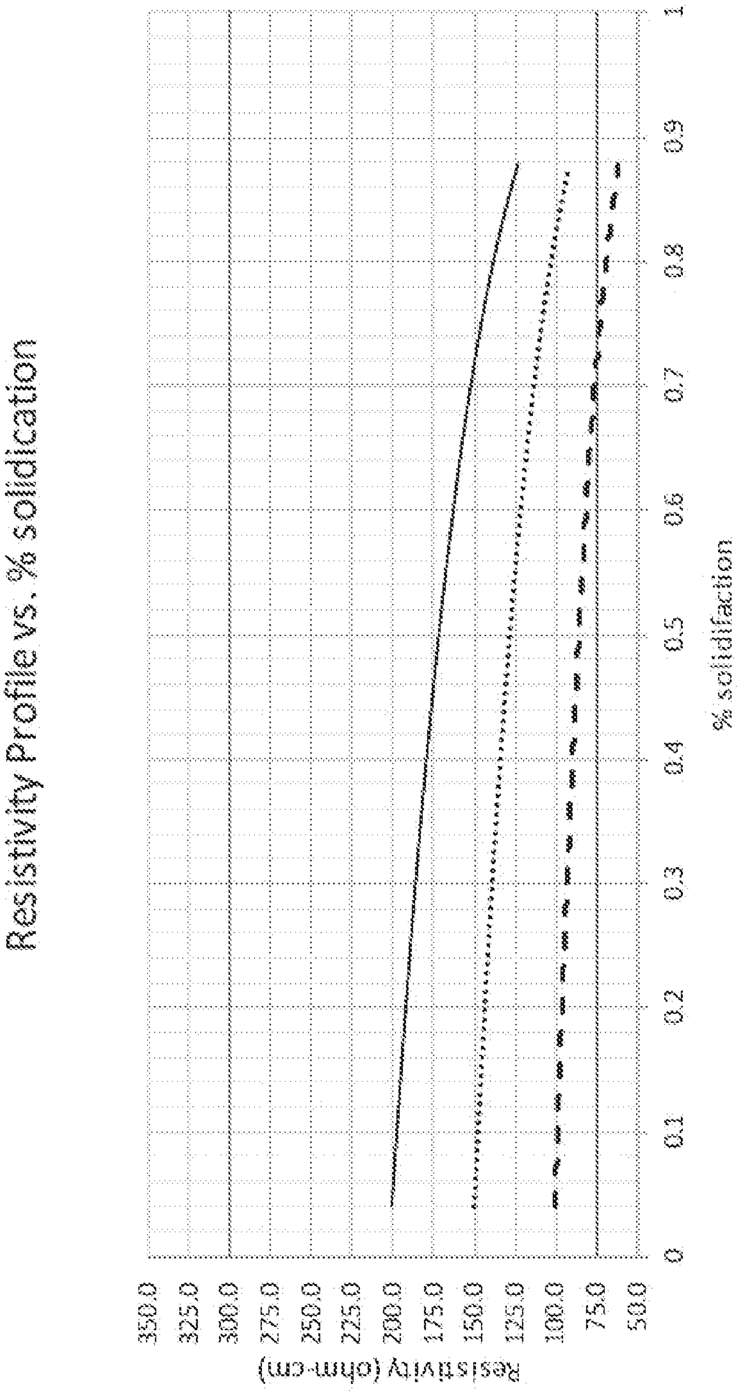
FIG. 18 is a graph showing the change in resistivity over the length of the main body of the ingot for a p-type boron-doped ingot for 100, 150 and 200 ohm-cm seed-end ingots.

FIG. 18 shows the resistivity profile as a function of percent solidification (g-value) for typical seed end targets of 100, 150 and 200 ohm-cm for P-type boron-doped crystals. In FIG. 18, the upper limit is set at 300 ohm-cm and the lower limit at 75 ohm-cm. As shown in the FIG. 18, the crystal prime length is limited to 72% of the solid fraction for a seed-end target of 100 ohm-cm (the upper limit for a 400° C. 20 hour anneal).

Figure 19:
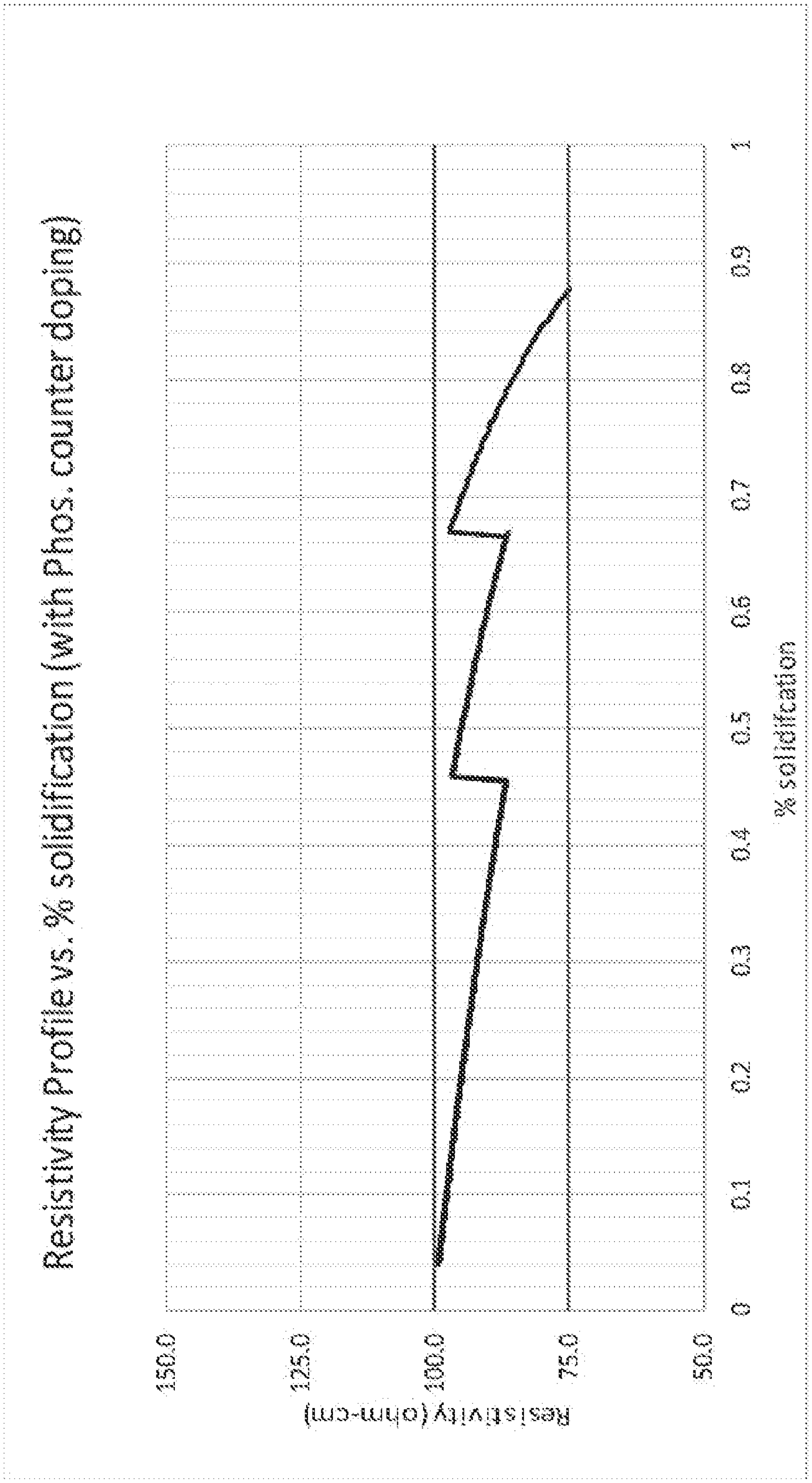
FIG. 19 is a graph showing the change in resistivity over the length of the main body of the ingot for a p-type boron-doped ingot with 100 ohm-cm seed-end resistivity with two phosphorous counter-doping cycles.

Phosphorus gas phase counter-doping can be used to reset the resistivity during growth of the mid-body of the main portion of the ingot to enable full body prime length as shown in FIG. 19. In this case, the melt close to the crystal growth interface during crystal growth at 46% and 67% solidification fraction is countered doped with gas phase phosphorus. This prophetic example demonstrates that intermittent doping with phosphorus can enable the resistivity to remain within the necessary 75-100 ohm-cm range required to remain less than 300 ohm-cm after a 20 hour anneal at 400° C.

Figure 20:
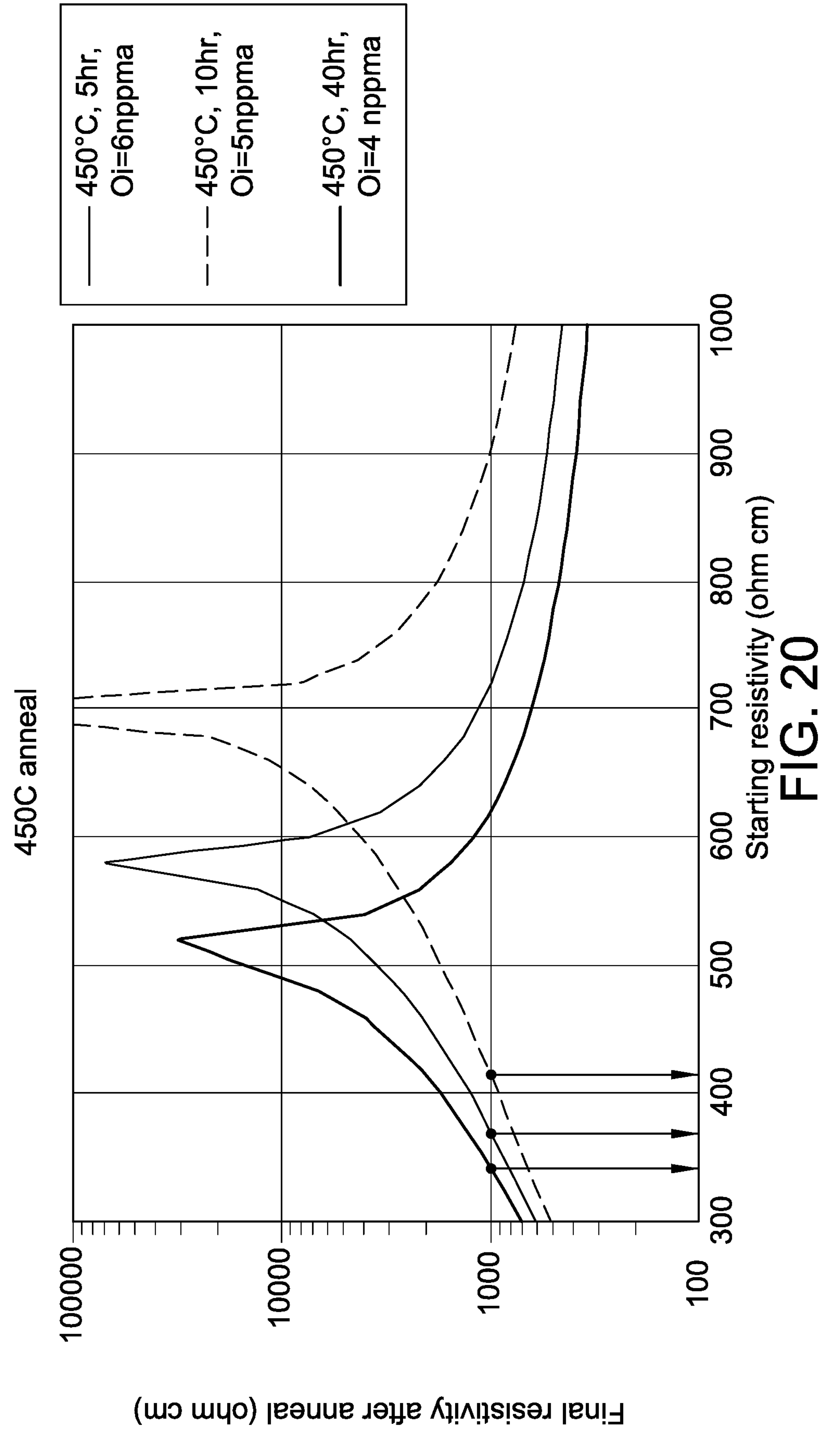
FIG. 20 is a graph showing the final resistivity as a function of starting resistivity for wafers annealed for 5, 10 and 40 hours (6 nppma, 5 nppma, 4 nppma, respectively)

In the case of 450° C., representative examples of crystal upper resistivity limits as a function of oxygen and time are shown in FIG. 20. A crystal resistivity post-anneal upper limit of 300-1000 ohm-cm is strongly impacted by oxygen and time. As shown in FIG. 20, the 6 nppma Oi upper resistivity limit at the 5 hour anneal is ~380 ohm-cm, the 5 nppma Oi upper resistivity limit at a 10 hour anneal is ~420 ohm-cm and the 4 nppma Oi upper resistivity limit for a 40 hour anneal is ~340 ohm-cm.

Figure 21:
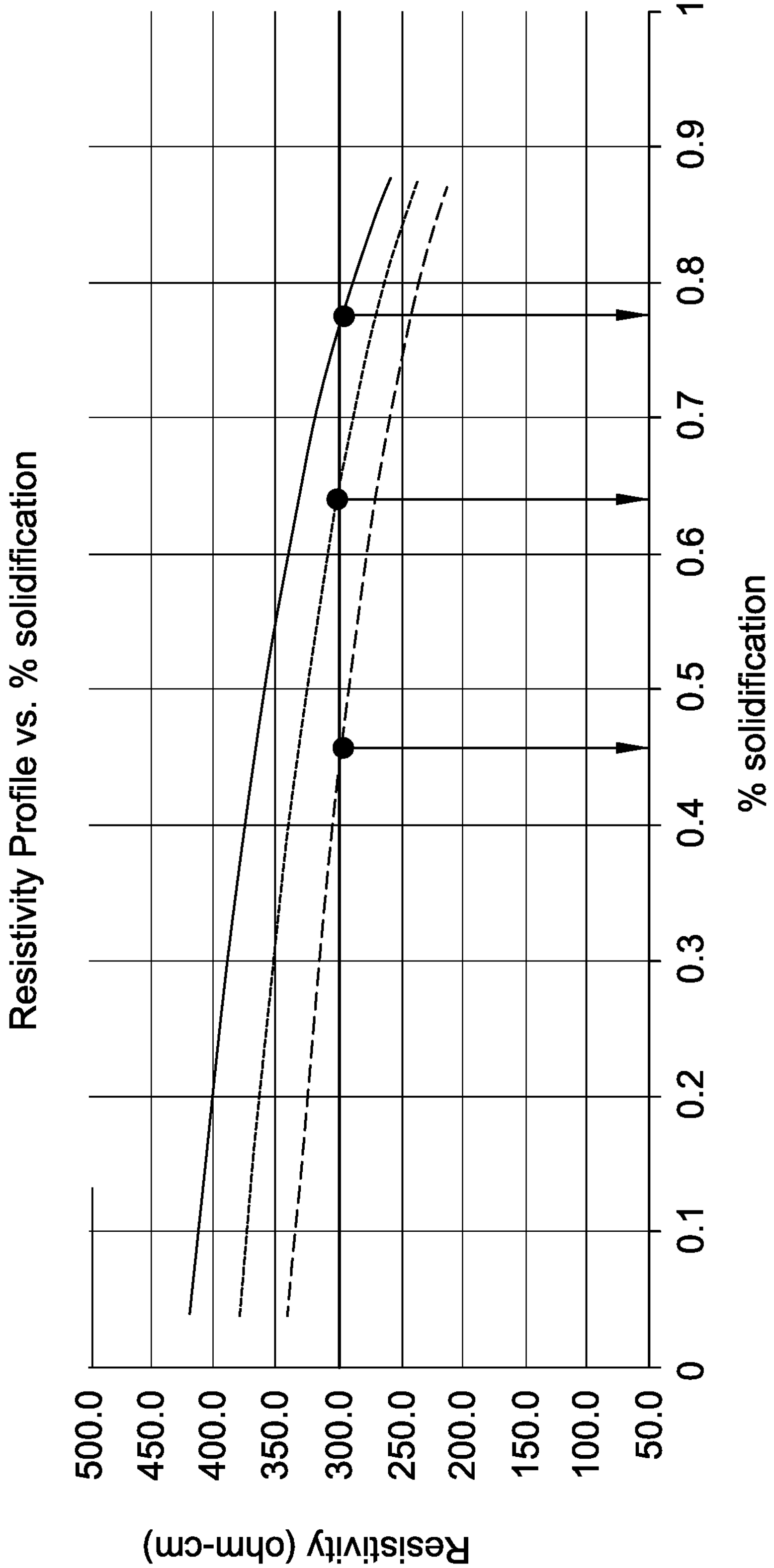
FIG. 21 is a graph showing the change in resistivity over the length of the main body of the ingot for p-type boron-doped ingots with 320, 380 and 420 ohm-cm seed-end oxygen.

FIG. 21 shows the corresponding resistivity profiles (320, 380, 420 ohm-cm seed-end) for the boron doped crystals grown with normal segregation including the prime length body length (arrow) where the crystal falls below the 300 ohm-cm specification limit.

Figure 22:
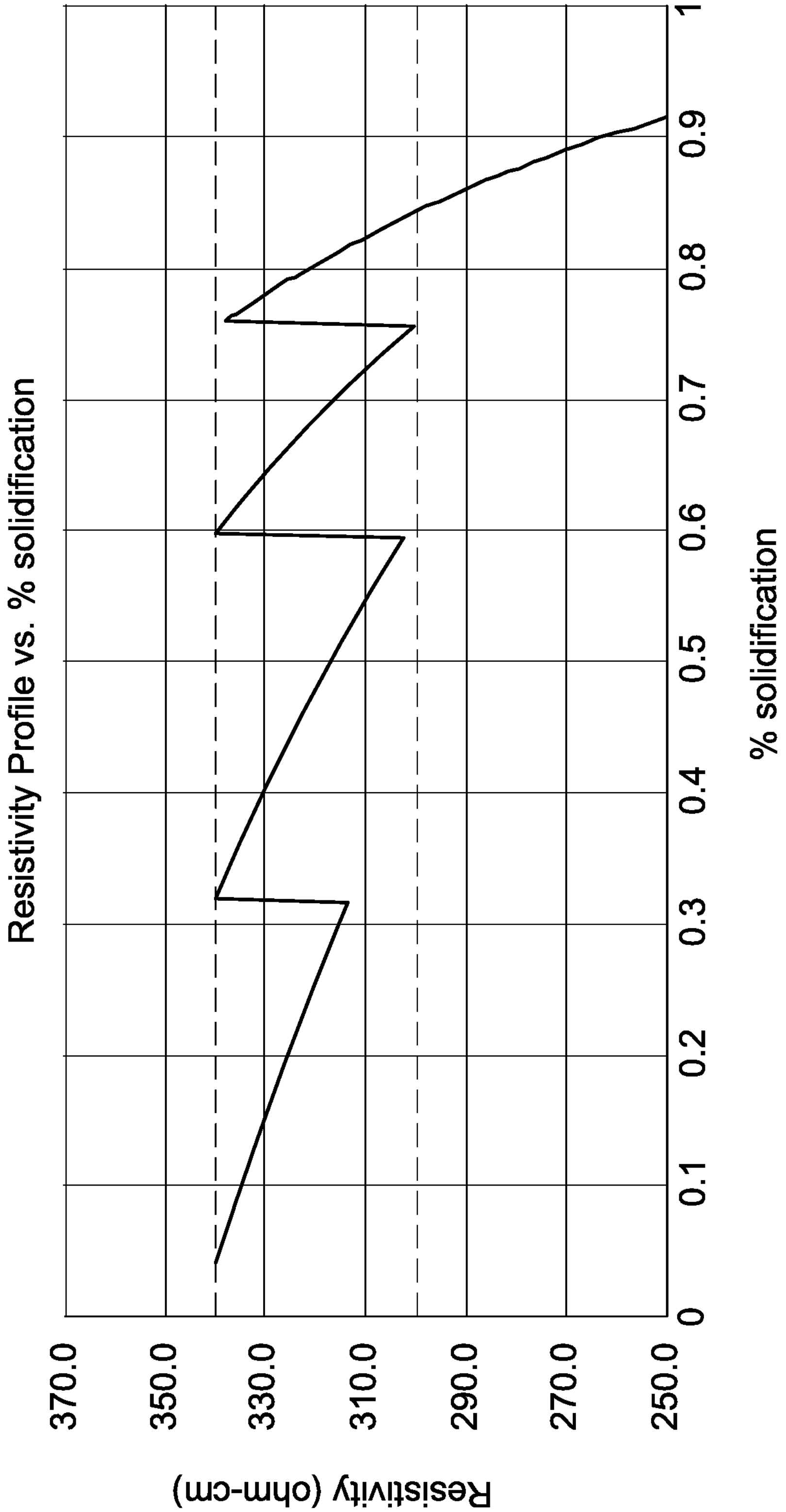
FIG. 22 is a graph showing the change in resistivity over the length of the main body of the ingot for a p-type boron-doped ingot with 340 ohm-cm seed-end resistivity with three phosphorous counter-doping cycles.

FIG. 22 shows the case where gas phase counter-doping with phosphorus can be effectively used to maintain resistivity between 340 ohm-cm and a lower limit of 300 ohm-cm for 4 nppma Oi for an anneal at 450° C. for 40 hours. In the example, prime length is extended from about 32% solidification to nearly full body length.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a," "an," "the," and "said" are intended to mean that there are one or more of the elements. The terms "comprising," "including," "containing," and "having" are intended to be inclusive and mean that there may be additional elements other than the listed elements. The use of terms indicating a particular orientation (e.g., "top," "bottom," "side," etc.) is for convenience of description and does not require any particular orientation of the item described.

As various changes could be made in the above constructions and methods without departing from the scope of the disclosure, it is intended that all matter contained in the above description and shown in the accompanying drawing [s] shall be interpreted as illustrative and not in a limiting sense.

What is claimed is:

1. A method for producing a single crystal silicon ingot from a silicon melt held within a crucible, the method comprising:
- determining a post-anneal target resistivity for wafers sliced from the single crystal silicon ingot, the post-anneal target resistivity being the target resistivity of the wafers after an anneal of the wafers;
- modeling thermal donors generated during the anneal of the wafers sliced from the single crystal silicon ingot to determine a pre-anneal wafer resistivity target range, the pre-anneal wafer resistivity target range being a resistivity target range of the wafers before the anneal;
- modeling a dopant profile of the melt during single crystal silicon ingot growth to determine a counter-doping schedule in which the silicon melt is doped with a first dopant and a second dopant is added to the silicon melt in two or more cycles during ingot growth, the counter-doping schedule resulting in at least a portion of the single crystal silicon ingot being within the pre-anneal wafer resistivity target range;
- adding polycrystalline silicon to the crucible;
- heating the polycrystalline silicon to cause the silicon melt to form in the crucible;
- adding the first dopant to the crucible, the first dopant being p-type or n-type;
- contacting the melt with a seed crystal;
- withdrawing the seed crystal from the melt to form the single crystal silicon ingot; and
- adding the second dopant to the silicon melt while forming the single crystal silicon ingot based on the counter-doping schedule, the second dopant being of a type different from the type of the first dopant, the second dopant being added in two or more cycles.

2. The method as set forth in claim 1 wherein the modeling thermal donors generated during the anneal of the wafers sliced from the single crystal silicon ingot comprises inputting a temperature of the anneal and a length of the anneal into the model.

3. The method as set forth in claim 2 wherein the modeling thermal donors generated during the anneal of the wafers sliced from the single crystal silicon ingot comprises inputting an oxygen content of the wafers into the model.

4. The method as set forth in claim 2 wherein the anneal is at a temperature of at least 300° C.

5. The method as set forth in claim 2 wherein the anneal is at a temperature of at least 500° C.

6. The method as set forth in claim 2 wherein a length of time of the anneal is at least 5 hours.

7. The method as set forth in claim 2 wherein a length of time of the anneal is at least 20 hours.

8. The method as set forth in claim 2 wherein the wafers sliced from the single crystal silicon ingot are used in a device manufacturing process and wherein the anneal is part of the device manufacturing process.

9. The method as set forth in claim 2 wherein the wafers sliced from the single crystal silicon ingot are used in an interposer device manufacturing process and wherein the anneal is part of the interposer device manufacturing process.

10. The method as set forth in claim 1 wherein the first dopant is p-type.

11. The method as set forth in claim 10 wherein the first dopant is selected from the group consisting of boron, gallium, aluminum, and indium.

12. The method as set forth in claim 10 wherein the first dopant is boron.

13. The method as set forth in claim 10 wherein the second dopant is selected from the group consisting of phosphorous, antimony, and arsenic.

14. The method as set forth in claim 10 wherein the second dopant is phosphorous.

15. The method as set forth in claim 1 wherein the single crystal silicon ingot has a constant diameter portion and at least 50% of a length of the constant diameter portion is within the pre-anneal wafer resistivity target range.

16. The method as set forth in claim 1 wherein the single crystal silicon ingot has a constant diameter portion and at least 95% of a length of the constant diameter portion is within the pre-anneal wafer resistivity target range.

17. The method as set forth in claim 1 wherein the post-anneal target resistivity comprises a minimum resistivity, maximum resistivity, or a range of resistivity.

18. The method as set forth in claim 17 wherein the post-anneal target resistivity is at least 300 Ω-cm.

19. The method as set forth in claim 1 wherein the modeling the thermal donors generated during the anneal of the wafers sliced from the single crystal silicon ingot to determine a pre-anneal wafer resistivity target range comprises:

storing in a memory of a computer system a model for determining the pre-anneal wafer resistivity target range of the wafers sliced from the single crystal silicon ingot; and executing the model using an oxygen content of the wafers, a length of the anneal, and a temperature of the anneal as inputs.

20. The method as set forth in claim 1 wherein the modeling the dopant profile of the melt during the single crystal silicon ingot growth to determine the counter-doping schedule in which the single crystal silicon ingot is within the pre-anneal wafer resistivity target range comprises:

storing in a memory of a computer system a model for determining the dopant profile of the melt during the single crystal silicon ingot growth; and executing the model using an initial doping amount of the melt and the pre-anneal wafer resistivity target range.

* * * * *